US010759981B2

(12) United States Patent
Takahashi et al.

(10) Patent No.: US 10,759,981 B2
(45) Date of Patent: Sep. 1, 2020

(54) POLISHING METHOD AND POLISHING COMPOSITION

(71) Applicant: FUJIMI INCORPORATED, Kiyosu-shi (JP)

(72) Inventors: Shuhei Takahashi, Kiyosu (JP); Masatoshi Tomatsu, Kiyosu (JP)

(73) Assignee: FUJIMI INCORPORATED (JP)

( * ) Notice: Subject to any disclaimer, the term of this patent is extended or adjusted under 35 U.S.C. 154(b) by 0 days.

(21) Appl. No.: 16/254,930

(22) Filed: Jan. 23, 2019

(65) Prior Publication Data

US 2019/0153278 A1 May 23, 2019

Related U.S. Application Data

(62) Division of application No. 15/525,017, filed as application No. PCT/JP2015/080843 on Oct. 30, 2015, now Pat. No. 10,227,517.

(51) Int. Cl.
| | |
|---|---|
| C09K 3/14 | (2006.01) |
| C09G 1/02 | (2006.01) |
| H01L 21/02 | (2006.01) |
| B24B 37/04 | (2012.01) |
| H01L 21/304 | (2006.01) |
| B24B 1/00 | (2006.01) |
| H01L 29/16 | (2006.01) |

(52) U.S. Cl.
CPC .............. *C09K 3/1409* (2013.01); *B24B 1/00* (2013.01); *B24B 37/042* (2013.01); *B24B 37/044* (2013.01); *C09G 1/02* (2013.01); *C09K 3/1463* (2013.01); *H01L 21/02024* (2013.01); *H01L 21/304* (2013.01); *H01L 29/1608* (2013.01)

(58) Field of Classification Search
CPC ........... B24B 37/044; B24B 1/00; C09G 1/02; C09K 3/1463; H01L 21/02024
See application file for complete search history.

(56) References Cited

U.S. PATENT DOCUMENTS

| | | | |
|---|---|---|---|
| 5,916,453 A | 6/1999 | Beilin et al. | |
| 10,227,517 B2 * | 3/2019 | Takahashi | C09K 3/1409 |
| 2004/0152309 A1 | 8/2004 | Carter et al. | |
| 2004/0221799 A1 | 11/2004 | Nakayama et al. | |
| 2004/0235396 A1 * | 11/2004 | Hattori | H01L 21/31053 451/41 |
| 2006/0040593 A1 | 2/2006 | Ikenaka et al. | |
| 2006/0236922 A1 | 10/2006 | Ishibashi et al. | |
| 2006/0292728 A1 | 12/2006 | Ishibashi et al. | |
| 2007/0021040 A1 | 1/2007 | Kawata et al. | |
| 2007/0149097 A1 | 6/2007 | Fujii et al. | |
| 2008/0271667 A1 | 11/2008 | Ishibashi et al. | |
| 2008/0272392 A1 | 11/2008 | Ishibashi et al. | |
| 2009/0318063 A1 | 12/2009 | Misra | |
| 2010/0123168 A1 | 5/2010 | Ishibashi et al. | |
| 2010/0200865 A1 | 8/2010 | Fujito et al. | |
| 2010/0227532 A1 | 9/2010 | Ishibashi et al. | |
| 2011/0012233 A1 | 1/2011 | Ishibashi et al. | |
| 2012/0223417 A1 | 9/2012 | Ishibashi et al. | |
| 2012/0240478 A1 | 9/2012 | Horiuchi et al. | |
| 2012/0240479 A1 | 9/2012 | Doi et al. | |
| 2012/0267606 A1 | 10/2012 | Ishibashi et al. | |
| 2013/0237128 A1 | 9/2013 | David et al. | |
| 2013/0256700 A1 | 10/2013 | Ishibashi | |
| 2013/0260558 A1 * | 10/2013 | Oota | B24B 37/044 438/693 |
| 2013/0292802 A1 | 11/2013 | Ishibashi et al. | |
| 2014/0057438 A1 | 2/2014 | Yoshida et al. | |
| 2014/0094032 A1 | 4/2014 | Yoshida et al. | |
| 2014/0124826 A1 | 5/2014 | Ishibashi et al. | |
| 2014/0187043 A1 | 7/2014 | Yoshida et al. | |
| 2014/0242750 A1 | 8/2014 | Sato et al. | |
| 2014/0248776 A1 | 9/2014 | Asano et al. | |
| 2014/0291811 A1 | 10/2014 | Ishibashi et al. | |
| 2014/0349112 A1 | 11/2014 | Ishibashi et al. | |
| 2015/0202700 A1 | 7/2015 | Kondo et al. | |
| 2015/0354058 A1 | 12/2015 | Morinaga et al. | |
| 2016/0257854 A1 | 9/2016 | Omori et al. | |
| 2017/0115239 A1 | 4/2017 | Ishibashi et al. | |

(Continued)

FOREIGN PATENT DOCUMENTS

| | | |
|---|---|---|
| CN | 102484181 A | 5/2012 |
| CN | 103890127 | 6/2014 |
| CN | 103890127 A | 6/2014 |

(Continued)

OTHER PUBLICATIONS

Written Opinion of the International Searching Authority for International Application No. PCT/JP2015/080843 dated Jan. 19, 2016.
Extended European Search Report for EP Patent Application 158580373.3 dated Aug. 1, 2018.
First Office Action for JP Patent Application No. 2015-215119 dated Aug. 1, 2019.
Decision for Refusal in JP Patent Application No. 2015-130440 dated Aug. 1, 2019.
3rd Office Action in CN Application No. 201580060437.7 dated Sep. 23, 2019.
1st Office Action in U.S. Appl. No. 16/254,930, dated Sep. 18, 2019.
3rd Office Action in JP Patent Application No. 2015-130439 dated Nov. 14, 2019.

(Continued)

*Primary Examiner* — Duy Vu N Deo

(74) *Attorney, Agent, or Firm* — Katten Munchin Rosenman LLP

(57) ABSTRACT

Provided is a method for polishing a material having a Vickers hardness of 1500 Hv or higher. The polishing method comprises a step of carrying out preliminary polishing using a preliminary polishing composition that comprises an abrasive $A_{PRE}$ and a step of carrying out final polishing using a final polishing composition that comprises an abrasive $A_{FIN}$ lower in hardness than the abrasive $A_{PRE}$.

10 Claims, No Drawings

(56) References Cited

U.S. PATENT DOCUMENTS

2017/0283988 A1  10/2017  Ishibashi et al.

FOREIGN PATENT DOCUMENTS

| | | |
|---|---|---|
| EP | 2477237 A1 | 7/2012 |
| EP | 2511358 | 10/2012 |
| EP | 2511358 A1 | 10/2012 |
| JP | H07-288243 A | 10/1995 |
| JP | H09-262757 A | 10/1997 |
| JP | H11188610 | 7/1999 |
| JP | 2004356609 A | 12/2004 |
| JP | 2006-93666 A | 4/2006 |
| JP | 2006179647 | 7/2006 |
| JP | 2006179647 A | 7/2006 |
| JP | 2006310362 | 11/2006 |
| JP | 2006310362 A | 11/2006 |
| JP | 2006-332437 A | 12/2006 |
| JP | 2007021703 A | 2/2007 |
| JP | 2007-533141 A | 11/2007 |
| JP | 2007311586 A | 11/2007 |
| JP | 2008-68390 A | 3/2008 |
| JP | 2010-023199 A | 2/2010 |
| JP | 201023199 A | 2/2010 |
| JP | 2010182782 | 8/2010 |
| JP | 2010182782 A | 8/2010 |
| JP | 2011513991 A | 4/2011 |
| JP | 2011-121153 A | 6/2011 |
| JP | 2011165909 A | 8/2011 |
| JP | 2012-248569 A | 12/2012 |
| JP | 2013120885 | 6/2013 |
| JP | 2013120885 A | 6/2013 |
| JP | 2014-024154 A | 2/2014 |
| TW | 201247730 A | 12/2012 |
| WO | 2005/099388 A2 | 10/2005 |
| WO | 2009111001 A2 | 3/2009 |
| WO | 2011070898 A1 | 11/2010 |
| WO | 2012147605 A1 | 1/2012 |
| WO | 2013035539 | 3/2013 |
| WO | 2013150822 A1 | 10/2013 |
| WO | 2014112218 | 11/2013 |
| WO | 2014112218 A1 | 11/2013 |
| WO | 2015059987 A1 | 4/2015 |

OTHER PUBLICATIONS

Decision to Grant in JP Patent Application No. 2015-130438 dated Oct. 3, 2019.
Final Office Action for U.S. Appl. No. 15/524,989 dated Aug. 30, 2019.
Extended European Search Report for EP Patent Application No. 158580373.3 dated Aug. 1, 2018.
Office Action for CN Patent Application No. 201580060437.7 dated Jun. 19, 2018.
2nd Office Action for CN Patent Application No. 201580060434.3 dated Jun. 5, 2019.
Xiandai, Current Process Technique Experiments, Beihang University Press, 2014, pp. 66-67.
1st Office Action for JP Patent Application No. 2015-215119 dated Aug. 1, 2019.
Decision of Refusal in JP Patent Application No. 2015-130440 dated Aug. 1, 2019.
Office Action for JP Patent Application No. 2015-130439 dated Nov. 15, 2018.
Office Action for TW Patent Application 104136497 dated Jan. 13, 2020.
First Office Action in TW Patent Application No. 104136498 dated Jan. 13, 2020.
Office Action for U.S. Appl. No 15/524,989 dated Dec. 23, 2019.
3rd Office Action for CN Patent Application 201580060434.3 dated Mar. 3, 2020.
Decision to Grant a Patent for JP Patent Application No. 2015-130439.
Concise Locksmith Manual, pp. 464-467.
Decision of Rejection for CN 201580060437.7 dated Apr. 15, 2020.
First Office Action in EP Patent Application No. 15 856 847.7 dated Jun. 17, 2020.
First Office Action in EP Patent Application No. 17 001 211.6 dated Jun. 17, 2020.

\* cited by examiner

POLISHING METHOD AND POLISHING COMPOSITION

The present application is a divisional of U.S. patent application Ser. No. 15/525,017, filed May 5, 2017, which is a 371 of PCT/JP2015/080843, filed Oct. 30, 2015, which claims priority to Japanese Patent Application Nos. 2014-227388 filed on Nov. 7, 2014, 2015-130438 filed on Jun. 29, 2015, and 2015-130439 filed on Jun. 29, 2015; and the entire contents thereof are incorporated herein by reference.

TECHNICAL FIELD

The present invention relates to a polishing method and a polishing composition used in the method. In particular, it relates to a method for polishing a super-hard material such as single crystal silicon carbide and a polishing composition used in the method.

BACKGROUND ART

With respect to super-hard materials such as diamond, sapphire (aluminum oxide), silicon carbide, boron carbide, tungsten carbide, silicon nitride and titanium nitride, smooth surfaces are typically obtained by polishing (lapping) processes in which diamond abrasives are supplied to platens for polishing. However, in a lapping process using a diamond abrasive, the formation of scratches and leftover scratches are limiting factors in increasing the surface smoothness. Thus, studies are underway for a polishing process that is carried out after or instead of diamond lapping, using a polishing pad and polishing slurry supplied to the interface between the polishing pad and an object to be polished. Publications disclosing this type of conventional art include Patent Documents 1 to 5.

CITATION LIST

Patent Literature

[Patent Document 1] Japanese Patent Application Publication No. H7-288243
[Patent Document 2] Japanese Patent Application Publication No. 2007-533141
[Patent Document 3] Japanese Patent Application Publication No. 2011-121153
[Patent Document 4] Japanese Patent Application Publication No. 2012-248569
[Patent Document 5] Japanese Patent Application Publication No. 2014-24154

SUMMARY OF INVENTION

Technical Problem

The conventional art documents suggest the use of certain components (abrasives, oxidants, etc.) in their slurries used for polishing (in their polishing compositions) so as to improve surface smoothness and polishing speed. However, the means of increasing smoothness are usually associated with poorer machining power; and therefore, efforts to increase smoothness may rather lower the overall flatness of the polished surface. For instance, in Patent Document 1, after diamond lapping, polishing is performed with colloidal silica abrasive; however, the lapping is limited in increasing the flatness and even upon subsequent polishing, it is difficult to quickly reduce the roughness of the lapped surface.

With respect to polishing of super-hard materials such as silicon carbide, basic features such as polishing speed and smoothness are still underdeveloped for practical applications. Flatness is mentioned, for instance, in Patent Document 4; however, it is studied in a single-step polishing process and thus, the required level of flatness is not particularly high. Needless to say with respect to polishing of super-hard materials associated with a significant reduction in machining power in designs where smoothness is important, it is harder to achieve smoothness and flatness together when compared to polishing of silicon wafers, glass substrates and the like. Polishing of super-hard materials has been at such a technical level and studies on combining smoothness and flatness have not at least reached a practical level.

In view of such circumstances, the present inventors have departed from following in steps of the conventional art documents and studying components of polishing compositions to search for a solution and have found a basic technical idea that enables efficient polishing in less time with smoothness and flatness combined at a level that wouldn't have been achieved by the conventional art, thereby completing the present invention. In other words, an objective of this invention is to provide a polishing method capable of efficiently achieving both smoothness and flatness. Another related objective is to provide a polishing composition suited for carrying out such a polishing method.

Solution to Problem

The invention according to the first aspect provided by this description provides a method for polishing a material having a Vickers hardness of 1500 Hv or higher. The polishing method comprises a step of carrying out preliminary polishing using a preliminary polishing composition that comprises an abrasive $A_{PRE}$; and a step of carrying out final polishing using a final polishing composition that comprises an abrasive $A_{FIN}$ lower in hardness than the abrasive $A_{PRE}$.

The polishing method can efficiently achieve both smoothness and flatness on a surface of a super-hard material. According to the art disclosed herein, on a super-hard surface, smoothness and flatness can be achieved at an unattainable level for the conventional art by a highly productive method.

As used herein, lapping refers to a polishing process carried out by pressing the surface of a platen for polishing against an object to be polished. Thus, polishing pads are not used in the lapping process. Typically the lapping process refers to a polishing process carried out with an abrasive (typically a diamond abrasive) supplied between the platen and the object to be polished. Polishing refers to a polishing process carried out using a polishing pad, typically a polishing process carried out after a lapping process, using a polishing pad attached on the surface of a platen and supplying a polishing slurry between the polishing pad and the object to be polished.

In a preferable embodiment of the art disclosed herein, the abrasive $A_{PRE}$ has a Vickers hardness in a range of 800 Hv to 3000 Hv, and the abrasive $A_{FIN}$ has a Vickers hardness in a range of 200 Hv to 1500 Hv With the use of selected abrasive $A_{PRE}$ for preliminary polishing and abrasive $A_{FIN}$ for final polishing with such hardness, smoothness and flatness can be efficiently combined at a higher level on a super-hard surface.

In a preferable embodiment of the art disclosed herein, the abrasive $A_{PRE}$ has a mean secondary particle diameter $P_{PRE}$ larger than the mean secondary particle diameter $P_{FIN}$ of the abrasive $A_{FIN}$. By selecting the preliminary polishing abrasive $A_{PRE}$ and the final polishing abrasive $A_{FIN}$ so that their mean secondary particle diameters satisfy the aforementioned relation, both smoothness and flatness can be more efficiently achieved at a higher level on a super-hard surface.

In a preferable embodiment of the art disclosed herein, the preliminary polishing composition comprises a water-soluble polishing aid $B_{PRE}$ and the final polishing composition comprises a water-soluble polishing aid $B_{FIN}$. With the inclusion of a suitable water-soluble polishing aid in each of the preliminary polishing composition and the final polishing composition, smoothness and flatness can be more preferably combined on a super-hard surface.

In a preferable embodiment of the art disclosed herein, the polishing aid $B_{PRE}$ comprises a composite metal oxide $CMO_{PRE}$. The composite metal oxide $CMO_{PRE}$ has a monovalent or divalent metal (but not a transition metal), and a transition metal in the fourth period of the periodic table. With the use of the composite oxide as the polishing aid $B_{PRE}$ for preliminary polishing, the flatness tends to further increase on a super-hard material.

In a preferable embodiment of the art disclosed herein, the polishing aid BIN comprises a composite metal oxide $CMO_{FIN}$. The composite metal oxide $CMO_{FIN}$ has a monovalent or divalent metal (but not a transition metal) or ammonia, and a transition metal in the fifth or sixth period of the periodic table. With the use of the composite oxide as the polishing aid $B_{FIN}$ for final polishing, there is a tendency that both smoothness and flatness are achieved at a higher level on a super-hard material.

In a preferable embodiment of the art disclosed herein, the polishing aid $B_{FIN}$ further comprises an oxygen-containing substance capable of supplying oxygen to the composite metal oxide $CMO_{FIN}$. In such an embodiment, the composite metal oxide $CMO_{FIN}$ tends to continuously work to produce chemical effects, whereby both smoothness and flatness can be achieved at a high level on a super-hard material.

The invention according to the first aspect given by this description provides a composition (a preliminary polishing composition) that is used in preliminary polishing carried out before final polishing in a polishing method disclosed herein. The composition comprises an abrasive $A_{PRE}$ harder than an abrasive $A_{FIN}$ used in the final polishing. With the use of the preliminary polishing composition, the polishing method disclosed herein can be preferably practiced.

The invention according to the first aspect given by this description provides a composition (a final polishing composition) that is used in final polishing carried out after preliminary polishing in a polishing method disclosed herein. The composition comprises an abrasive $A_{FIN}$ lower in hardness than an abrasive $A_{PRE}$ used in preliminary polishing. With the use of the final polishing composition, the polishing method disclosed herein can be preferably practiced.

The invention according to the second aspect given by this description provides a method for polishing a material having a Vickers hardness of 1500 Hv or higher. The polishing method comprises a step of carrying out preliminary polishing using a preliminary polishing composition and a step of carrying out final polishing using a final polishing composition. The preliminary polishing composition has an oxidation-reduction potential $ORP_{PRE}$ vs. standard hydrogen electrode and the final polishing composition has an oxidation-reduction potential $ORP_{FIN}$ vs. standard hydrogen electrode, satisfying the relation $ORP_{PRE} > ORP_{FIN}$.

This polishing method can efficiently achieve both smoothness and flatness on a super-hard surface. According to the art disclosed herein, on a super-hard surface, smoothness and flatness can be achieved at an unattainable level for the conventional art by a highly productive method.

In a preferable embodiment of the art disclosed herein, the ratio ($ORP_{PRE}/ORP_{FIN}$) of the preliminary polishing composition's oxidation-reduction potential $ORP_{PRE}$ to the final polishing composition's oxidation-reduction potential $ORP_{FIN}$ is $1.2 \leq ORP_{PRE}/ORP_{FIN} \leq 4.0$. This polishing method can achieve both smoothness and flatness at a higher level on a super-hard surface.

In a preferable embodiment of the art disclosed herein, the preliminary polishing composition has an oxidation-reduction potential $ORP_{PRE}$ in a range of 700 mV to 1500 mV and the final polishing composition has an oxidation-reduction potential $ORP_{FIN}$ in a range of 300 mV to 650 mV. With the use of the preliminary polishing composition having such an oxidation-reduction potential $ORP_{PRE}$ and the final polishing composition having such an oxidation-reduction potential $ORP_{FIN}$, smoothness and flatness can be combined at a higher level on a super-hard surface.

The invention according to the second aspect given by the present description provides a composition (a preliminary polishing composition) used in preliminary polishing carried out before final polishing in a polishing method disclosed herein. This preliminary composition satisfies $ORP_{PRE} > ORP_{FIN}$, with respect to the relation between the oxidation-reduction potential $ORP_{FIN}$ (vs. standard hydrogen electrode) of the final polishing composition used in final polishing and the oxidation-reduction potential $ORP_{PRE}$ (vs. standard hydrogen electrode) of this preliminary composition. With the use of this preliminary polishing composition, the polishing method disclosed herein can be preferably practiced.

The invention according to the second aspect given by the present description provides a composition (a final polishing composition) used in final polishing carried out after preliminary polishing in a polishing method disclosed herein. This composition satisfies the relation $ORP_{PRE} > ORP_{FIN}$ composition, with the preliminary polishing composition used in preliminary polishing having an oxidation-reduction potential $ORP_{PRE}$ vs. standard hydrogen electrode and the final polishing composition having an oxidation-reduction potential $ORP_{FIN}$ vs. standard hydrogen electrode. With the use of the final polishing composition, the polishing method disclosed herein can be preferably practiced.

The invention according to the third aspect given by the present description provides a method for polishing a material having a Vickers hardness of 1500 Hv or higher. The polishing method comprises a preliminary polishing step using a preliminary polishing composition that comprises an abrasive $A_{PRE}$, and a final polishing step using a final polishing composition that comprises an abrasive $A_{FIN}$. The preliminary polishing composition has a standard polishing removal rate $R_{PRE}$ on a SiC wafer and the final polishing composition has a standard polishing removal rate on the SiC wafer, satisfying the relation $R_{PRE} > R_{FIN}$.

The polishing method can efficiently bring about both smoothness and flatness on a super-hard surface. According to the art disclosed herein, on a super-hard surface, smoothness and flatness can be achieved at an unattainable level for the conventional art by a highly productive method.

In a preferable embodiment of the art disclosed herein, the ratio ($R_{PRE}/R_{FIN}$) of the standard polishing removal rate $R_{PRE}$ of the preliminary polishing composition to the standard polishing removal rate $R_{FIN}$ of the final polishing composition is $1.5 \leq R_{PRE}/R_{FIN} \leq 5.0$. The polishing method can achieve higher levels of smoothness and flatness together on a super-hard surface.

In a preferable embodiment of the art disclosed herein, the abrasive $A_{PRE}$ has a mean secondary particle diameter $P_{PRE}$ and the abrasive $A_{FIN}$ has a mean secondary particle diameter $P_{FIN}$, satisfying the relation $P_{PRE} > P_{FIN}$. By selecting each of the abrasive $A_{PRE}$ for preliminary polishing and the abrasive $A_{FIN}$ for final polishing so that their mean secondary particle diameters satisfy the relation, both smoothness and flatness can be achieved at a higher level on a super-hard surface.

In a preferable embodiment of the art disclosed herein, the abrasive $A_{PRE}$ has a Vickers hardness $H_{PRE}$ and the abrasive $A_{FIN}$ has a Vickers hardness $H_{FIN}$, satisfying the relation $H_{PRE} > H_{FIN}$. By selecting each of the abrasive $A_{PRE}$ for preliminary polishing and the abrasive $A_{FIN}$ for final polishing so that their Vickers hardness satisfy the relation, both smoothness and flatness can be achieved at a higher level on a super-hard surface.

The invention according to the third aspect given by the present description provides a composition (a preliminary polishing composition) used in preliminary polishing carried out before final polishing in a polishing method disclosed herein. This composition satisfies the relation $R_{PRE} > R_{FIN}$, with the final polishing composition used in final polishing having a standard polishing removal rate $R_{FIN}$ on a SiC wafer and the preliminary polishing composition having a standard polishing removal rate $R_{PRE}$ on the SiC wafer, satisfying the. With the use of the preliminary polishing composition, the polishing method disclosed herein can be preferably practiced.

The invention according to the third aspect given by the present description provides a composition (a final polishing composition) used in final polishing carried out after preliminary polishing in a polishing method disclosed herein. This composition satisfies the relation $R_{PRE} > R_{FIN}$, with the preliminary polishing composition used in preliminary polishing having a standard polishing removal rate $R_{PRE}$ on a SiC wafer and the final polishing composition having a standard polishing removal rate $RN$ on the SiC wafer. With the use of the preliminary polishing composition, the polishing method disclosed herein can be preferably practiced.

DESCRIPTION OF EMBODIMENTS

Preferred embodiments of the present invention are described below. Matters necessary to practice this invention other than those specifically referred to in this description may be understood as design matters based on the conventional art in the pertinent field for a person of ordinary skill in the art. The present invention can be practiced based on the contents disclosed in this description and common technical knowledge in the subject field.

<<1. First Aspect>>

The polishing method according to the first aspect disclosed herein comprises a step of carrying out preliminary polishing (a preliminary polishing step) using a preliminary polishing composition and a step of carrying out final polishing (a final polishing step) using a final polishing composition. Hereinafter, the objects to be polished, the preliminary polishing composition, the final polishing composition, and the polishing method are described in this order.

<1-1. Objects to be Polished>

The polishing method according to the first aspect disclosed herein is a method for polishing a material having a Vickers hardness of 1500 Hv or higher (or a super-hard material). The polishing method according to the first aspect disclosed herein can efficiently achieve both smoothness and flatness on a surface of such a super-hard material. The Vickers hardness of the super-hard material is preferably 1800 Hv or higher (e.g. 2000 Hv or higher, typically 2200 Hv or higher). The maximum Vickers hardness is not particularly limited. It can be about 7000 Hv or lower (e.g. 5000 Hv or lower, typically 3000 Hv or lower). In the present description, Vickers hardness can be determined based on JIS R 1610:2003 to which International standard ISO 14705:2000 corresponds.

Examples of the material having a Vickers hardness of 1500 Hv or higher include diamond, sapphire (aluminum oxide), silicon carbide, boron carbide, tungsten carbide, silicon nitride and titanium nitride. The polishing method disclosed herein can be preferably applied to a single crystal surface of the mechanically- and chemically-stable material. In particular, the polished surface is preferably formed of silicon carbide. Silicon carbide is expected to be a material for semiconductor substrates with little power loss, excellent heat resistance, etc. Thus, it is particularly advantageous for practical use to improve the surface conditions. The polishing method disclosed herein is particularly preferably applied to a single crystal silicon carbide surface.

<1-2. Preliminary Polishing Composition>

(1-2-1. Abrasive $A_{PRE}$)

The preliminary polishing composition according to the first aspect disclosed herein comprises an abrasive $A_{PRE}$. The abrasive $A_{PRE}$ is harder than the abrasive $A_{FIN}$ used in the final polishing described later. This can efficiently increase the flatness. In particular, the ratio ($H_{PRE}/H_{FIN}$) of the abrasive $A_{PRE}$'s Vickers hardness $H_{PRE}$ to the abrasive $A_{FIN}$'s Vickers hardness $H_{FIN}$ is greater than 1. From the standpoint of efficiently achieving both smoothness and flatness, it is preferably 1.3 to 4.0, more preferably 1.8 to 3.0, or yet more preferably 2.1 to 2.5.

From the standpoint of increasing the flatness, the abrasive $A_{PRE}$'s Vickers hardness is preferably 800 Hv or higher, more preferably 1200 Hv or higher, or yet more preferably 1500 Hv or higher. The maximum Vickers hardness of the abrasive $A_{PRE}$ is not particularly limited. From the standpoint of achieving both smoothness and flatness, it is preferably 3000 Hv or lower, more preferably 2000 Hv or lower, or yet more preferably 1700 Hv or lower. In the present description, for the Vickers hardness of an abrasive, the value determined based on JIS R 1610:2003 with respect to the material used as the abrasive is used.

The abrasive $A_{PRE}$'s Vickers hardness is preferably equal to or lower than the Vickers hardness of the material forming the surface of the object to be polished (i.e. the material subject to polishing). Because the hardness of the abrasive $A_{PRE}$ is limited in relation to the hardness of the material to be polished, degradation of flatness tends to be inhibited. The Vickers hardness of the abrasive $A_{PRE}$ is preferably lower than that of the material to be polished by at least 300 Hv (e.g. at least 500 Hv). From the standpoint of increasing the flatness, the difference in Vickers hardness between the abrasive $A_{PRE}$ and the material to be polished is preferably 1000 Hv or less (e.g. 800 Hv or less). This tends to preferably bring about both smoothness and flatness.

The material and the properties of the abrasive $A_{PRE}$ are not particularly limited as long as it satisfies the relation to the abrasive $A_{FIN}$ with respect to the hardness. For instance, the abrasive $A_{PRE}$ may be inorganic particles, organic particles, or inorganic/organic composite particles. Examples include an abrasive substantially formed of any of the following: oxide particles such as silica particles, alumina particles, cerium oxide particles, chromium oxide particles, titanium dioxide particles, zirconium oxide particles, magnesium oxide particles, manganese dioxide particles, zinc oxide particles, and iron oxide particles; nitride particles such as silicon nitride particles and boron nitride particles; carbide particles such as silicon carbide particles and boron carbide particles; diamond particles; and carbonates such as calcium carbonate and barium carbonate. For the abrasive, solely one species or a combination of two or more species can be used. In particular, oxide particles are preferable, such as silica particles, alumina particles, cerium oxide particles, chromium oxide particles, zirconium oxide particles, manganese dioxide particles, and iron oxide particles, because they can form good surfaces. Among them, alumina particles, zirconium oxide particles, chromium oxide particles and iron oxide particles are more preferable; and alumina particles are particularly preferable.

As used herein, with respect to the composition of an abrasive, "substantially consisting of X" or being "substantially formed of X" means that the ratio of X in the abrasive (or the purity of X) is 90% or higher (preferably 95% or higher, more preferably 97% or higher, or yet more preferably 98% or higher, e.g. 99% or higher) by weight.

When alumina particles are used as the abrasive $A_{PRE}$, in general, the higher the alumina particle content is in the total abrasive $A_{PRE}$ in the preliminary polishing composition, the more advantageous it is. For instance, the alumina particle content in the total abrasive $A_{PRE}$ in the preliminary polishing composition is preferably 70% by weight or higher, more preferably 90% by weight or higher, yet more preferably 95% by weight or higher (e.g. 95% to 100% by weight).

The preliminary polishing composition disclosed herein is preferably substantially free of diamond particles as the abrasive $A_{PRE}$. Because of the super hardness, diamond particles can be a limiting factor in increasing the flatness. In addition, diamond particles are generally expensive and thus are not considered advantageous in terms of cost performance. In practical aspects, it is desirable to be less dependent on expensive materials such as diamond particles.

The abrasive $A_{PRE}$ usually has a mean secondary particle diameter of 20 nm or larger. From the standpoint of increasing the flatness, it is preferably 100 nm or larger, more preferably 200 nm or larger (e.g. 400 nm or larger). The abrasive $A_{PRE}$ with such a mean secondary particle diameter can bring about excellent flatness more efficiently. From the standpoint of obtaining a sufficient number of particles per unit weight, the maximum mean secondary particle diameter of the abrasive $A_{PRE}$ is suitably about 5000 nm or smaller. From the standpoint of combining higher levels of smoothness and flatness, the mean secondary particle diameter is preferably 3000 nm or smaller, or more preferably 2000 nm or smaller (e.g. 800 nm or smaller).

With respect to the abrasive's mean secondary particle diameter, for particles smaller than 500 nm, it can be determined as the volume mean particle diameter (arithmetic mean diameter by volume, Mv) by dynamic light scattering, using, for instance, model UPA-UT151 available from Nikkiso Co., Ltd.; for particles of 500 nm or larger, it can be determined as the volume mean particle diameter by pore electrical resistance, etc., using model MULTISIZER 3 available from Beckman Coulter Inc.

The mean secondary particle diameter $P_{PRE}$ of the abrasive $A_{PRE}$ is preferably larger than the mean secondary particle diameter $P_{FIN}$ of the abrasive $A_{FIN}$. This can more preferably combine smoothness and flatness on a super-hard surface. In a preferable embodiment, the ratio ($P_{PRE}/P_{FIN}$) of the mean secondary particle diameter $P_{PRE}$ of the abrasive $A_{PRE}$ to the mean secondary particle diameter $P_{FIN}$ of the abrasive $A_{FIN}$ is about 1.0 to 20. From the standpoint of efficiently achieving smoothness and flatness together, the ratio ($P_{PRE}/P_{FIN}$) is preferably 2.0 to 10, or more preferably 4.0 to 6.0.

From the standpoint of the polishing efficiency the concentration of the abrasive in the preliminary polishing composition is usually suitably 1% by weight or higher. From the standpoint of increasing the flatness, the abrasive concentration is preferably 3% by weight or higher, or more preferably 5% by weight or higher. In view of efficiently achieving high levels of both smoothness and flatness and in view of obtaining good dispersibility the abrasive concentration of the preliminary polishing composition is usually suitably 50% by weight or lower, preferably 20% by weight or lower, more preferably 10% by weight or lower, or yet more preferably 8% by weight or lower.

(1-2-2. Polishing Aid $B_{PRE}$)

The preliminary polishing composition according to the first aspect disclosed herein preferably comprises a polishing aid $B_{PRE}$. The polishing aid $B_{PRE}$ is a component that enhances the effects of preliminary polishing, and a water-soluble species is typically used. The polishing aid $B_{PRE}$ is thought to contribute to the polishing with the abrasive $A_{PRE}$, by working to alter (typically oxidize) the surface being polished in the preliminary polishing and bring about embrittlement of the polished surface, but is not particularly limited to this.

Examples of the polishing aid $B_{PRE}$ include peroxides such as hydrogen peroxide; nitric acid compounds such as nitric acid, its salts (iron nitrate, silver nitrate, aluminum nitrate), and its complexes (ceric ammonium nitrate, etc.); persulfuric acid compounds such as persulfuric acids including peroxomonosulfuric acid and peroxodisulfuric acid as well as its salts (ammonium persulfate, potassium persulfate, etc.); chlorine compounds such as chloric acid and its salts, perchloric acid and its salts (potassium perchlorate, etc.); bromine compounds such as bromic acid and its salts (potassium bromate); iodine compounds such as iodic acid and its salts (ammonium iodate), periodic acid and its salts (sodium periodate, potassium periodate, etc.); ferrates including ferric acid and its salts (potassium ferrate, etc.); permanganates including permanganate acid and its salts (sodium permanganate, potassium permanganate, etc.); chromates including chromic acid and its salts (potassium chromate, potassium dichromate, etc.); vanadates including vanadic acid and its salts (ammonium vanadate, sodium, potassium vanadate); ruthenates including perruthenic acid and its salts; molybdates including molybdic acid and its salts (ammonium molybdate, disodium molybdate, etc.); rhenates including perrhenic acid and its salts; and tungstates including tungstic acid and its salts (disodium tungstate, etc.). These can be used singly as one species or in a combination of two or more species. In particular, permanganic acid or a salt thereof, chromic acid or a salt thereof, and ferric acid or a salt thereof are preferable. Sodium permanganate and potassium permanganate are particularly preferable.

In a preferable embodiment, the preliminary polishing composition comprises a composite metal oxide as the polishing aid $B_{PRE}$. Examples of the composite metal oxide include metal nitrates, ferrates, permanganates, chromates, vanadates, ruthenates, molybdates, rhenates and tungstates. In particular, ferrates, permanganates and chromates are more preferable; permanganates are even more preferable.

In a more preferable embodiment, as the composite metal oxide, a composite metal oxide $CMO_{PRE}$ is used, with the composite metal oxide having a monovalent or divalent metal (but not a transition metal) and a transition metal in the fourth period of the periodic table. Favorable examples of the monovalent or divalent metal (but not a transition metal) include Na, K, Mg and Ca. Among them, Na and K are more preferable. Favorable examples of the transition metal in the fourth period of the periodic table include Fe, Mn, Cr, V and Ti. Among them, Fe, Mn and Cr are more preferable, with Mn being yet more preferable.

When the preliminary polishing composition disclosed herein comprises a composite metal oxide (preferably a composite metal oxide $CMO_{PRE}$) as the polishing aid $B_{PRE}$, it may or may not further comprise other polishing aid $B_{PRE}$ besides the composite metal oxide. The art disclosed herein can be preferably practiced in an embodiment substantially free of other polishing aid $B_{PRE}$ (e.g. hydrogen peroxide) besides the composite metal oxide (preferably a composite metal oxide $CMO_{PRE}$) as the polishing aid $B_{PRE}$.

The concentration of the polishing aid $B_{PRE}$ in the preliminary polishing composition is usually suitably 0.1% by weight or higher. From the standpoint of increasing the flatness, the polishing aid concentration is preferably 0.5% by weight or higher, or more preferably 1% by weight or higher. From the standpoint of obtaining high levels of both smoothness and flatness, the concentration of the polishing aid $B_{PRE}$ is usually suitably 10% by weight or lower, preferably 3% by weight or lower, or more preferably 2% by weight or lower.

(1-2-3. Other Components)

As long as the effects of the present invention are not impaired, the preliminary polishing composition according to the first aspect disclosed herein may further comprise, as necessary known additives that can be used in polishing compositions (typically polishing compositions for super-hard materials, e.g. polishing compositions for silicon carbide substrates), such as chelating agent, thickener, dispersing agent, pH-adjusting agent, surfactant, organic acids, organic acid salts, inorganic acid, inorganic acid salts, anticorrosive, preservative, and antifungal agent. The amounts of the additives contained can be suitably selected in accordance with their purposes and do not characterize the present invention; and therefore, details are omitted.

(1-2-4. Solvent)

The solvent used in the preliminary polishing composition according to the first aspect disclosed herein is not particularly limited as long as it allows dispersion of the abrasive. As the solvent, ion-exchanged water (deionized water), pure water, ultrapure water, distilled water and the like can be preferably used. The preliminary polishing composition disclosed herein may further comprise, as necessary, an organic solvent (a lower alcohol, a lower ketone, etc.) that can be uniformly mixed with water. In typical, water preferably accounts for 90% by volume or more of the solvent in the preliminary polishing composition; water more preferably accounts for 95% by volume or more (typically 99% to 100% by volume).

The preliminary polishing composition according to the first aspect disclosed herein is not particularly limited in pH. The pH of the preliminary polishing composition is usually suitably about 2 to 12. The preliminary polishing composition having a pH value in this range is likely to achieve practical polishing efficiency. The preliminary polishing composition has a pH value of preferably 6 to 10, or more preferably 8.5 to 9.5.

The method for preparing the preliminary polishing composition disclosed herein is not particularly limited. For instance, the respective components of the preliminary polishing composition may be mixed with a known mixing device such as a propeller stirrer, ultrasonic disperser, and homo mixer. The mode of mixing these components is not particularly limited. For instance, all the components can be mixed at once or in a suitably prescribed order.

<1-3. Final Polishing Composition>

(1-3-1. Abrasive $A_{FIN}$)

The final polishing composition according to the first aspect disclosed herein comprises an abrasive $A_{FIN}$. The abrasive $A_{FIN}$ has lower hardness than the abrasive $A_{PRE}$ used in preliminary polishing. This can efficiently increase the smoothness. In particular, from the standpoint of bringing about both smoothness and flatness, the abrasive $A_{FIN}$ has a Vickers hardness of preferably 200 Hv or higher, more preferably 400 Hv or higher, or yet more preferably 600 Hv or higher. The maximum Vickers hardness of the abrasive $A_{FIN}$ is not particularly limited. From the standpoint of increasing the smoothness, it is preferably 1500 Hv or lower, more preferably 1000 Hv or lower, or yet more preferably 800 Hv or lower.

The material and properties of the abrasive $A_{FIN}$ are not particularly limited as long as it satisfies the relation with the abrasive $A_{PRE}$ with respect to the hardness. For instance, the abrasive $A_{FIN}$ can be inorganic particles, organic particles, or organic-inorganic composite particles. As the abrasive $A_{FIN}$, one, two or more species can be preferably used among the examples of the abrasive $A_{PRE}$. Among them, oxide particles are more preferable, such as silica particles, alumina particles, cerium oxide particles, chromium oxide particles, zirconium oxide particles, manganese dioxide particles, iron oxide particles, and magnesium oxide particles; silica particles, cerium oxide particles, and manganese dioxide particles are yet more preferable; silica particles are particularly preferable.

The silica particles include colloidal silica, fumed silica and precipitated silica. From the standpoint of increasing the smoothness, colloidal silica and fumed silica are preferable. In particular, colloidal silica is especially preferable.

When silica particles are used as the abrasive $A_{FIN}$, in general, the higher the silica particle content is in the total abrasive $A_{FIN}$ in the final polishing composition, the more advantageous it is. For instance, the silica particle content of the total abrasive $A_{FIN}$ in the final polishing composition is preferably 70% by weight or higher, more preferably 90% by weight or higher, or yet more preferably 95% by weight or higher (e.g. 95% to 100% by weight).

The mean secondary particle diameter of the abrasive $A_{FIN}$ is not particularly limited. From the standpoint of the polishing efficiency it is preferably 20 nm or larger, more preferably 70 nm or larger, or yet more preferably 90 nm or larger. From the standpoint of obtaining a smoother surface, the mean secondary particle diameter of the abrasive $A_{FIN}$ is suitably 500 nm or smaller, preferably 300 nm or smaller, more preferably 200 nm or smaller, yet more preferably 130 nm or smaller, or particularly preferably 110 nm or smaller.

From the standpoint of the polishing efficiency the abrasive concentration in the final polishing composition is usually suitably 3% by weight or higher. From the standpoint of efficiently increasing the smoothness, the abrasive concentration is preferably 10% by weight or higher, or more preferably 20% by weight or higher. From the standpoint of efficiently achieving high levels of both smoothness and flatness, the abrasive concentration in the final polishing composition is usually suitably 50% by weight or lower, preferably 40% by weight or lower, or more preferably 30% by weight or lower.

(1-3-2. Polishing Aid $B_{FIN}$)

The final polishing composition according to the first aspect disclosed herein preferably comprises a polishing aid $B_{FIN}$. The polishing aid $B_{FIN}$ is a component that enhances the effects of final polishing, and a water-soluble species is typically used. Similarly to the polishing aid $B_{PRE}$ in the aforementioned preliminary polishing, the polishing aid $B_{FIN}$ is thought to contribute to the polishing efficiency and the surface quality (especially an increase in smoothness) of the object to be polished, by working to alter (typically oxidize) the polished surface in the final polishing and bring about embrittlement of the polished surface, but is not particularly limited to this.

As the polishing aid $B_{FIN}$, one, two or more species can be preferably used among the examples of the polishing aid $B_{PRE}$. Among them, vanadic acid or a salt thereof, an iodine compound, molybdic acid or a salt thereof, and tungstic acid or a salt thereof are preferable. Sodium vanadate and potassium vanadate are particularly preferable.

In a preferable embodiment, the final polishing composition comprises a composite metal oxide as the polishing aid $B_{FIN}$. Examples of the composite metal oxide include metal nitrates, ferrates, permanganates, chromates, vanadates, ruthenates, molybdates, rhenates and tungstates. In particular, vanadates, molybdates and tungstates are more preferable; vanadates are even more preferable.

In a more preferable embodiment, as the composite metal oxide, a composite metal oxide $CMO_{FIN}$ is used, with the composite metal oxide having a monovalent or divalent metal (but not a transition metal) or ammonia, and a transition metal in group 5 or group 6 of the periodic table. Favorable examples of the monovalent or divalent metal (but not a transition metal) or ammonia include Na, K, Mg, Ca and ammonia. Among them, Na and K are more preferable. The transition metal in group 5 or group 6 of the periodic table is selected preferably among the elements in the fourth, fifth and sixth periods; more preferably among the elements in the fourth and fifth periods; or yet more preferably among the elements in the fourth period. The transition metal is preferably selected among group 5 elements. Specific examples include V, Nb, Ta, Cr, Mo, and W. In particular, V, Mo and W are more preferable, and V is yet more preferable.

When the final polishing composition disclosed herein comprises a composite metal oxide (preferably a composite metal oxide $CMO_{FIN}$) as the polishing aid $B_{FIN}$, it is preferable that, as other polishing aid $B_{FIN}$ besides the composite metal oxide, it further comprises an oxygen-containing substance capable of supplying oxygen to the composite metal oxide (preferably a composite metal oxide $CMO_{FIN}$). By this, the composite metal oxide $CMO_{FIN}$ (preferably a composite metal oxide $CMO_{FIN}$) works to continuously produce chemical effects, whereby the polishing efficiency of the final polishing can significantly increase and high levels of both smoothness and flatness can be obtained with super-hard materials. Favorable examples of the oxygen-containing substance include hydrogen peroxide, ozone, and peracids. Among them, hydrogen peroxide is particularly preferable.

The concentration of the polishing aid $B_{FIN}$ in the final polishing composition is usually suitably 0.1% by weight or higher. From the standpoint of efficiently obtaining high levels of both smoothness and flatness, the polishing aid concentration is preferably 0.5% by weight or higher, or more preferably 1% by weight or higher (e.g. 1.5% by weight or higher). From the standpoint of increasing the smoothness, the concentration of the polishing aid $B_{FIN}$ is usually suitably 15% by weight or lower, preferably 10% by weight or lower, or more preferably 5% by weight or lower (e.g. 3% by weight or lower, or 2.5% by weight or lower).

As for the polishing aid $B_{FIN}$, when using both a composite metal oxide (preferably a composite metal oxide $CMO_{FIN}$) and an oxygen-containing substance capable of supplying oxygen to the metal oxide, the concentration of the composite metal oxide is usually suitably 0.1% by weight or higher. From the standpoint of efficiently obtaining high levels of smoothness and flatness together, the composite metal oxide concentration is preferably 0.5% by weight or higher, or more preferably 1.5% by weight or higher. From the standpoint of increasing the smoothness, the composite metal oxide concentration is usually suitably 10% by weight or lower, preferably 3% by weight or lower, or more preferably 2.5% by weight or lower. In this embodiment, the concentration of the oxygen-containing substance is usually suitably 0.1% to 10% by weight; from the standpoint of preferably obtaining oxygen supplies, the concentration of the oxygen-containing substance is preferably 0.5% to 3% by weight, or more preferably 1% to 2% by weight.

The final polishing composition according to the first aspect disclosed herein is not particularly limited in pH. The pH of the final polishing composition is usually suitably about 2 to 12. The final polishing composition having a pH value in this range is likely to efficiently achieve excellent smoothness. The final polishing composition has a pH value of preferably 4 to 10, or more preferably 6 to 8.

With respect to other components and the solvent that can be used in the final polishing composition, the species that can be included in the preliminary polishing composition can be preferably used. Thus, their details are not repeated here. The final polishing composition can be prepared, for instance, by employing a similar method as the preparation method for the preliminary polishing composition or by making a suitable modification thereto based on technical common knowledge among those ordinarily skilled in the field.

<1-4. Polishing Composition Kit>

The art according to the first aspect disclosed herein may include, for instance, providing a polishing composition kit as following: The art disclosed herein provides a polishing composition kit comprising a preliminary polishing composition and a final polishing composition which are stored separately. The preliminary polishing composition can be a polishing slurry that is used in preliminary polishing in the polishing method disclosed herein or it can be a concentrate (concentrated formula) thereof. The final polishing composition can be a polishing slurry that is used in final polishing in the polishing method disclosed herein or it can be a concentrate (concentrated formula) thereof. According to the polishing composition kit, in a multi-step polishing process, both smoothness and flatness can be achieved on a super-hard surface. Such a polishing composition kit may contribute to a decrease in polishing time and an increase in productivity.

<1-5. Polishing Method>

The polishing method according to the first aspect disclosed herein comprises a step of carrying out preliminary polishing (a preliminary polishing step), and a step of carrying out final polishing (a final polishing step). The preliminary polishing step is a step where an object formed of a material having a Vickers hardness of 1500 Hv or higher at least on the surface (a surface to be polished) is subjected to preliminary polishing using a preliminary polishing composition that comprises an abrasive $A_{PRE}$. The final polishing step is a step where the preliminarily polished object is subjected to final polishing using a final polishing composition comprising an abrasive $A_{FIN}$ lower in hardness than the abrasive $A_{PRE}$.

In the polishing method, a preliminary polishing slurry is obtained, comprising a preliminary polishing composition according to the first aspect disclosed herein. In addition, a final polishing slurry is obtained, comprising a final polishing composition according to the first aspect disclosed herein. Obtaining the slurries include using the respective polishing compositions as they are as the polishing slurries (polishing liquids) or preparing the polishing slurries from the respective polishing compositions via operations such as concentration adjustment (e.g. dilution) and pH adjustment.

Preliminary polishing is carried out using the preliminary polishing slurry obtained. In particular, a super-hard surface subject to polishing is supplied with the preliminary polishing slurry and polished by a typical method. For instance, a lapped object is set in a general polishing machine and the preliminary polishing slurry is supplied via a polishing pad in the polishing machine to the surface of the object to be polished. In typical, while the preliminary polishing slurry is continuously supplied, the polishing pad is pushed against the surface of the object, and the two are moved (e.g. rotated) in coordination.

Subsequently, final polishing is carried out using the final polishing slurry obtained. In particular, a super-hard surface subject to polishing is supplied with the final polishing slurry and polished by a typical method. The final polishing is carried out by supplying the final polishing slurry via a polishing pad in the polishing machine to the preliminarily polished surface of the object. In typical, while the final polishing slurry is continuously supplied, the polishing pad is pushed against the surface of the object, and the two are moved (e.g. rotated) in coordination. Via these polishing steps, polishing of the super-hard surface is completed.

As used herein, the preliminary polishing step refers to a polishing step that is carried out before a final polishing step using a polishing slurry comprising an abrasive. In a typical embodiment, the preliminary polishing step is a polishing step that is arranged immediately before the final polishing step. The preliminary polishing step can be a single-stage polishing process or a multi-stage polishing process having two or more stages.

As used herein, the final polishing step refers to a polishing step that is arranged at last (i.e. on the most downstream side) among polishing steps carried out using abrasive-containing polishing slurries. Accordingly, the final polishing composition disclosed herein can be thought as a kind of polishing slurry that is used most downstream among polishing slurries used in a polishing process of a super-hard material.

The conditions of the preliminary polishing and the final polishing are suitably selected based on the object to be polished, desired surface conditions (specifically certain smoothness and flatness), the polishing efficiency and so on as well as technical common knowledge among those ordinarily skilled in the field. For instance, from the standpoint of the polishing efficiency the polishing pressure applied per $cm^2$ of processed area of the object to be polished is preferably 50 g or greater, or more preferably 100 g or greater. From the standpoint of preventing alteration of the surface being polished and degradation of the abrasive caused by excessive heat generated with increasing load, the polishing pressure per $cm^2$ of processed area is usually suitably 1000 g or less.

Linear velocity generally changes, influenced by the number of rotations of platen, the number of rotations of carrier, the size of the object to be polished, the number of objects to be polished, etc. With increasing linear velocity a higher polishing efficiency tends to be obtained. From the standpoint of preventing damage to the object to be polished and excessive heating of the object, the linear velocity can be limited to or below a certain level. The linear velocity can be selected based on technical common knowledge and is not particularly limited. It is preferably in a range of about 10 m/min to 1000 m/min, or more preferably in a range of 50 m/min to 300 m/min.

The amount of each polishing composition supplied during polishing is not particularly limited. It is desirable to select the amount supplied so that the amount of the polishing composition is enough to be supplied evenly and entirely over the surface of the object to be polished. The favorable amount to be supplied may also vary depending on the material of the object to be polished and the features of the polishing machine as well as other conditions. For instance, it is preferably in a range of 0.001 mL/min to 0.1 mL/min, or more preferably in a range of 0.003 mL/min to 0.03 mL/min per $mm^2$ of process area of the object to be polished.

The combined time of preliminary polishing and final polishing (the total polishing time) is not particularly limited. The polishing method disclosed herein can achieve both smoothness and flatness on a super-hard surface in a total polishing time less than 5 hours. In a preferable embodiment, it can achieve both smoothness and flatness on a super-hard surface in a total polishing time less than 3 hours (e.g. 2.5 hours or less, typically 2 hours or less). The total polishing time does not include the intermittent time between the respective polishing steps (the time period during which polishing is not being performed, non-polishing time). For instance, the total polishing time does not include the time from the completion of the preliminary polishing step to the beginning of the final polishing step.

The preliminary polishing and the final polishing can be applied to polishing either with a single-side polishing machine or with a double-side polishing machine. With respect to the single-side polishing machine, the object to be polished is adhered to a ceramic plate with wax or held with a holder called a carrier; while supplying the polishing composition, a polishing pad is pushed against one face of the object and the two are moved (e.g. rotated) in coordination to polish the one face of the object. With respect to the double-side polishing machine, the object to be polished is held with a holder called a carrier; while supplying the polishing composition from the top, the platens are pushed against the opposing faces of the object and they are rotated in opposite directions to simultaneously polish the two faces of the object.

The polishing pads used in the respective polishing steps according to the first aspect disclosed herein are not particularly limited. For instance, any species can be used among non-woven fabric types, swede types, hard polyurethane foam types, abrasive-containing species, abrasive-free species, etc.

The object polished by the method according to the first aspect disclosed herein is typically cleaned after polished. The cleaning can be carried out using a suitable detergent. The detergent used is not particularly limited. A suitable species can be selected and used among detergents that are commonly known or used. The temperature of the detergent is not particularly limited. For instance, it is preferably in a range of 20° C. to 90° C., or more preferably in a range of 50° C. to 80° C.

The polishing method according to the first aspect disclosed herein may comprise an optional step in addition to the preliminary polishing step and the final polishing step. Such a step can be a lapping step carried out before the preliminary polishing step. In the lapping step, the surface of a platen (e.g. a cast iron platen) for polishing is pushed against the object to be polished to carry out polishing of the object. Thus, polishing pads are not used in the lapping step. The lapping step is typically carried out with an abrasive (typically a diamond abrasive) supplied between the platen for polishing and the object to be polished. The polishing method according to the first aspect disclosed herein may comprise an additional step (a cleaning step or a polishing step) before the preliminary polishing step, or between the preliminary polishing step and the final polishing step.

<<2. Second Aspect>>

The polishing method according to the second aspect disclosed herein comprises a step of carrying out preliminary polishing (a preliminary polishing step) using a preliminary polishing composition and a step of carrying out final polishing (a final polishing step) using a final polishing composition. Hereinafter, the polished object, the preliminary polishing composition, the final polishing composition, and the polishing method are described in this order.

<2-1. Objects to be Polished>

The polishing method according to the second aspect disclosed herein is a method for polishing a material having a Vickers hardness of 1500 Hv or higher (or a super-hard material). The polishing method according to the second aspect disclosed herein can bring about both smoothness and flatness on a surface of such a super-hard material. As for the super-hard material (the Vickers hardness and the material) according to the second aspect, the same kinds of super-hard materials described with respect to the polishing method according to the first aspect can be used.

<2-2. Preliminary Polishing Composition>

(2-2-0. Oxidation-Reduction Potential $ORP_{PRE}$)

The preliminary polishing composition according to the second aspect has a higher oxidation-reduction potential (ORP) vs. standard hydrogen electrode than the final polishing composition described later. In other words, the oxidation-reduction potential $ORP_{PRE}$ vs. standard hydrogen electrode of the preliminary polishing composition and the oxidation-reduction potential $ORP_{FIN}$ vs. standard hydrogen electrode of the final polishing composition satisfy the relation $ORP_{PRE} > ORP_{FIN}$. This can increase the flatness, thereby for instance, reducing the surface roughness over the entire object polished with the preliminary polishing composition. The oxidation-reduction potential of the polishing composition referred to herein is the oxidation-reduction potential value vs. standard hydrogen electrode determined at a liquid temperature of 25° C.

In particular, the ratio ($ORP_{PRE}/ORP_{FIN}$) of the oxidation-reduction potential $ORP_{PRE}$ of the preliminary polishing composition to the oxidation-reduction potential $ORP_{FIN}$ of the final polishing composition described later is higher than 1. From the standpoint of achieving both smoothness and flatness, the $ORP_{PRE}/ORP_{FIN}$ ratio is preferably 1.2 to 4.0, more preferably 1.4 to 3.0, yet more preferably 1.6 to 2.5, or particularly preferably 1.8 to 2.2. When the oxidation-reduction potential ratio ($ORP_{PRE}/ORP_{FIN}$) is 1.2 or higher, the flatness of the polished surface will increase further. When the oxidation-reduction potential ratio ($ORP_{PRE}/ORP_{FIN}$) is 4.0 or lower, higher levels of both smoothness and flatness can be obtained on a super-hard surface.

The oxidation-reduction potential $ORP_{PRE}$ of the preliminary polishing composition is not particularly limited as long as it satisfies the relation to the oxidation-reduction potential $ORP_{FIN}$ of the final polishing composition described later. From the standpoint of reducing the machining time, $ORP_{PRE}$ is preferably 700 mV or higher, more preferably 800 mV or higher, or yet more preferably 900 mV or higher. The maximum oxidation-reduction potential $ORP_{PRE}$ of the preliminary polishing composition is not particularly limited. From the standpoint of achieving both smoothness and flatness, it is preferably 3000 mV or lower, more preferably 2000 mV or lower, yet more preferably 1500 mV or lower, or further more preferably 1000 mV or lower. From the standpoint of combining greater smoothness and flatness, the preliminary polishing composition's oxidation-reduction potential $ORP_{PRE}$ is preferably greater than the final polishing composition's oxidation-reduction potential $ORP_{FIN}$ by 300 mV or more, or more preferably by 350 mV or more (e.g. 400 mV or more). The preliminary polishing composition's oxidation-reduction potential $ORP_{PRE}$ minus the final polishing composition's oxidation-reduction potential $ORP_{FIN}$ is preferably 800 mV or less, more preferably 600 mV or less, or yet more preferably 500 mV or less.

The preliminary polishing composition's oxidation-reduction potential $ORP_{PRE}$ can be adjusted, for instance, by changing the species of abrasive and/or polishing aid (e.g. agent that acts to oxidize the surface of the object during polishing) in the preliminary polishing composition or by changing the ratio of the abrasive and the polishing aid. In other words, by suitably selecting the species of abrasive and polishing aid in the preliminary polishing composition and their ratio, the oxidation-reduction potential $ORP_{PRE}$ of the preliminary polishing composition can be adjusted to the suitable range while satisfying the suitable relation disclosed herein. As for the method for adjusting the oxidation-reduction potential $ORP_{PRE}$ of the preliminary polishing composition to the suitable range while satisfying the suitable relation, a method for changing the pH of the composition can be employed. For controlling the oxidation-reduction potential $ORP_{PRE}$, solely one method or a combination of two or more methods can be used.

(2-2-1. Abrasive $A_{PRE}$)

The preliminary polishing composition according to the second aspect disclosed herein preferably comprises an abrasive $A_{PRE}$. As for the abrasive $A_{PRE}$ in the preliminary polishing composition according to the second aspect, the same kinds of abrasive $A_{PRE}$ described with respect to the preliminary polishing composition according to the first aspect can be used.

From the standpoint of increasing the flatness, the abrasive $A_{PRE}$ has a Vickers hardness of preferably 800 Hv or higher, more preferably 1200 Hv or higher, or yet more preferably 1500 Hv or higher. The maximum Vickers hardness of the abrasive $A_{PRE}$ is not particularly limited. From the standpoint of achieving both smoothness and flatness, it is preferably 3000 Hv or below, more preferably 2000 Hv or below, yet more preferably 1700 Hv or below. In the present description, for the Vickers hardness of an abrasive, the value determined based on JIS R 1610:2003 with respect to the material used as the abrasive is used.

The abrasive $A_{PRE}$'s Vickers hardness is preferably comparable to or lower than the Vickers hardness of the material forming the surface of the object to be polished (i.e. the material subject to polishing). Because the hardness of the abrasive $A_{PRE}$ is limited in relation to the hardness of the material to be polished, degradation of flatness tends to be inhibited. The Vickers hardness of the abrasive $A_{PRE}$ is preferably lower than that of the material to be polished by at least 300 Hv (e.g. at least 500 Hv). From the standpoint of increasing the flatness, the difference in Vickers hardness between the abrasive $A_{PRE}$ and the material to be polished is preferably 1000 Hv or less (e.g. 800 Hv or less). This tends to preferably bring about both smoothness and flatness.

The abrasive $A_{PRE}$ is preferably harder than the abrasive $A_{FIN}$ used in the final polishing described later. For instance, it is preferable that the abrasive $A_{PRE}$ in the preliminary polishing composition has a Vickers hardness $H_{PRE}$ and the abrasive $A_{FIN}$ in the final polishing composition has a Vickers hardness $H_{FIN}$, satisfying the relation $H_{PRE}>H_{FIN}$. This can further increase the flatness. In particular, the ratio $(H_{PRE}/H_{FIN})$ of the abrasive $A_{PRE}$'s Vickers hardness $H_{PRE}$ to the abrasive $A_{FIN}$'s Vickers hardness $H_{FIN}$ is higher than 1. From the standpoint of efficiently achieving both smoothness and flatness, the ratio $(H_{PRE}/H_{FIN})$ is preferably 1.3 to 4.0, more preferably 1.8 to 3.0, or yet more preferably 2.1 to 2.5.

The abrasive $A_{PRE}$ usually has a mean secondary particle diameter of 20 nm or larger. From the standpoint of increasing the flatness, etc., it is preferably 100 nm or larger, or more preferably 200 nm or larger (e.g. 400 nm or larger). The abrasive $A_{PRE}$ having such a mean secondary particle diameter can more efficiently achieve excellent flatness. From the standpoint of obtaining a sufficient number of particles per unit weight, the maximum mean secondary particle diameter of the abrasive $A_{PRE}$ is suitably about 5000 nm or smaller. From the standpoint of combining higher levels of smoothness and flatness, the mean secondary particle diameter is preferably 3000 nm or smaller, or more preferably 2000 nm or smaller (e.g. 800 nm or smaller).

With respect to the abrasive $A_{PRE}$'s mean secondary particle diameter, for particles smaller than 500 nm, it can be determined as the volume mean particle diameter (arithmetic mean diameter by volume, Mv) by dynamic light scattering, using, for instance, model UPA-UT151 available from Nikkiso Co., Ltd.; for particles of 500 nm or larger, it can be determined as the volume mean particle diameter by pore electrical resistance, etc., using model MULTISIZER 3 available from Beckman Coulter Inc.

The mean secondary particle diameter $P_{PRE}$ of the abrasive $A_{PRE}$ is preferably larger than the mean secondary particle diameter $P_{FIN}$ of the abrasive $A_{FIN}$ used in the final polishing described later. That is, the mean secondary particle diameter $P_{PRE}$ of the abrasive $A_{PRE}$ in the preliminary polishing composition and the mean secondary particle diameter $P_{FIN}$ of the abrasive $A_{FIN}$ in the final polishing composition preferably satisfy the relation $P_{PRE}>P_{FIN}$. This can more preferably combine smoothness and flatness on a super-hard surface. In a preferable embodiment, the ratio $(P_{PRE}/P_{FIN})$ of the mean secondary particle diameter $P_{PRE}$ of the abrasive $A_{PRE}$ to the mean secondary particle diameter $P_{FIN}$ of the abrasive $A_{FIN}$ is about 1.0 to 20. From the standpoint of efficiently achieving smoothness and flatness together, the ratio $(P_{PRE}/P_{FIN})$ is preferably 2.0 to 10, or more preferably 4.0 to 6.0.

From the standpoint of the polishing efficiency the concentration $C_{PRE}$ of the abrasive in the preliminary polishing composition is usually suitably 1% by weight or higher. From the standpoint of increasing the flatness, the abrasive concentration is preferably 3% by weight or higher, or more preferably 5% by weight or higher. In view of efficiently achieving high levels of both smoothness and flatness and in view of obtaining good dispersibility the abrasive concentration $C_{PRE}$ in the preliminary polishing composition is usually suitably 50% by weight or lower, preferably 20% by weight or lower, more preferably 10% by weight or lower, or yet more preferably 8% by weight or lower.

In a preferable embodiment, the abrasive concentration $C_{PRE}$ in the preliminary polishing composition is higher than the abrasive concentration $C_{FIN}$ in the final polishing composition described later. That is, the abrasive concentration $C_{PRE}$ in the preliminary polishing composition and the abrasive concentration $C_{FIN}$ in the final polishing composition satisfy the relation $C_{PRE}>C_{FIN}$. This can further increase the flatness.

In another preferable embodiment, the abrasive concentration $C_{PRE}$ in the preliminary polishing composition is lower than the abrasive concentration $C_{FIN}$ in the final polishing composition described later. That is, the abrasive concentration $C_{PRE}$ in the preliminary polishing composition and the abrasive concentration $C_{FIN}$ in the final polishing composition satisfy the relation $C_{PRE}<C_{FIN}$. This can bring about higher levels of smoothness and flatness on a super-hard surface. From the standpoint of achieving both smoothness and flatness, the ratio $(C_{PRE}/C_{FIN})$ of the abrasive concentration $C_{PRE}$ of the preliminary polishing composition to the abrasive concentration $C_{FIN}$ of the final polishing composition is preferably 0.1 to 10.0, more preferably 0.15 to 1.0, or yet more preferably 0.2 to 0.5.

(2-2-2. Polishing Aid $B_{PRE}$)

The preliminary polishing composition according to the second aspect disclosed herein preferably comprises a polishing aid $B_{PRE}$. The polishing aid $B_{PRE}$ is a component that enhances the effects of preliminary polishing, and a water-soluble species is typically used. The polishing aid $B_{PRE}$ is thought to contribute to the polishing with the abrasive $A_{PRE}$, by working to alter (typically oxidize) the surface being polished in the preliminary polishing and bring about embrittlement of the polished surface, but is not particularly limited to this.

The species of polishing aid $B_{PRE}$ is not particularly limited as long as the preliminary polishing composition satisfies the relation to the final polishing described later with respect to the oxidation-reduction potential. Examples of the polishing aid $B_{PRE}$ include peroxides such as hydrogen peroxide; nitric acid compounds such as nitric acid, its salts (iron nitrate, silver nitrate, aluminum nitrate), and its complexes (ceric ammonium nitrate, etc.); persulfuric acid compounds such as persulfuric acids including peroxomonosulfuric acid and peroxodisulfuric acid as well as its salts (ammonium persulfate, potassium persulfate, etc.); chlorine compounds such as chloric acid and its salts, perchloric acid and its salts (potassium perchlorate, etc.); bromine compounds such as bromic acid and its salts (potassium bromate); iodine compounds such as iodic acid and its salts (ammonium iodate), periodic acid and its salts (sodium periodate, potassium periodate, etc.); ferrates including ferric acid and its salts (potassium ferrate, etc.); permanganates including permanganate acid and its salts (sodium permanganate, potassium permanganate, etc.); chromates including chromic acid and its salts (potassium chromate, potassium dichromate, etc.); vanadates including vanadic acid and its salts (ammonium vanadate, sodium, potassium vanadate); ruthenates including perruthenic acid and its salts; molybdates including molybdic acid and its salts (ammonium molybdate, disodium molybdate, etc.); rhenates including perrhenic acid and its salts; and tungstates including tungstic acid and its salts (disodium tungstate, etc.). These can be used singly as one species or in a combination of two or more species. In particular, permanganic acid or a salt thereof, chromic acid or a salt thereof, and ferric acid or a salt thereof are preferable. Sodium permanganate and potassium permanganate are particularly preferable. The use of these compounds as the polishing aid $B_{PRE}$ can effectively increase the oxidation-reduction potential $ORP_{PRE}$ of the preliminary polishing composition to efficiently increase the flatness.

In a preferable embodiment, the preliminary polishing composition comprises a composite metal oxide as the polishing aid $B_{PRE}$. Examples of the composite metal oxide include metal nitrates, ferrates, permanganates, chromates, vanadates, ruthenates, molybdates, rhenates and tungstates. In particular, ferrates, permanganates and chromates are more preferable; permanganates are even more preferable.

In a more preferable embodiment, as the composite metal oxide, a composite metal oxide $CMO_{PRE}$ is used, with the composite metal oxide having a monovalent or divalent metal (but not a transition metal) and a transition metal in the fourth period of the periodic table. The inclusion of such a composite metal oxide $CMO_{PRE}$ as the polishing aid $B_{PRE}$ can effectively increase the oxidation-reduction potential $ORP_{PRE}$ of the preliminary polishing composition to efficiently increase the flatness. Favorable examples of the monovalent or divalent metal (but not a transition metal) include Na, K, Mg and Ca. Among them, Na and K are more preferable. Favorable examples of the transition metal in the fourth period of the periodic table include Fe, Mn, Cr, V and Ti. Among them, Fe, Mn and Cr are more preferable, with Mn being yet more preferable.

When the preliminary polishing composition according to the second aspect disclosed herein comprises a composite metal oxide (preferably a composite metal oxide $CMO_{PRE}$) as the polishing aid $B_{PRE}$, it may or may not further comprise other polishing aid $B_{PRE}$ besides the composite metal oxide. The art disclosed herein can be preferably practiced in an embodiment substantially free of other polishing aid $B_{PRE}$ (e.g. hydrogen peroxide) besides the composite metal oxide (preferably a composite metal oxide $CMO_{PRE}$) as the polishing aid $B_{PRE}$. This can efficiently increase the flatness.

The concentration $D_{PRE}$ of the polishing aid $B_{PRE}$ in the preliminary polishing composition is not particularly limited as long as the preliminary polishing composition satisfies the relation to the final polishing composition described later with respect to the oxidation-reduction potential. The concentration $D_{PRE}$ is usually suitably 0.1% by weight or higher. From the standpoint of increasing the flatness, the polishing aid concentration $D_{PRE}$ is preferably 0.5% by weight or higher, or more preferably 1% by weight or higher. From the standpoint of obtaining high levels of both smoothness and flatness, the concentration $D_{PRE}$ of the polishing aid $B_{PRE}$ is usually suitably 10% by weight or lower, preferably 3% by weight or lower, or more preferably 2% by weight or lower.

In a preferable embodiment, the concentration $D_{PRE}$ polishing aid $B_{PRE}$ in the preliminary polishing composition is higher (by weight) than the concentration $D_{FIN}$ of the polishing aid $B_{FIN}$ in the final polishing composition described later. That is, the concentration $D_{PRE}$ of the polishing aid $B_{PRE}$ in the preliminary polishing composition and the concentration $D_{FIN}$ of the polishing aid $B_{FIN}$ in the final polishing composition satisfy the relation $D_{PRE}>D_{FIN}$. This effectively increases the oxidation-reduction potential $ORP_{PRE}$ of the preliminary polishing composition. Thus, the flatness can be further increased.

In another preferable embodiment, the concentration $D_{PRE}$ polishing aid $B_{PRE}$ in the preliminary polishing composition is lower (by weight) than the concentration $D_{FIN}$ of the polishing aid $B_{FIN}$ in the final polishing composition described later. That is, the concentration $D_{PRE}$ of the polishing aid $B_{PRE}$ in the preliminary polishing composition and the concentration $D_{FIN}$ of the polishing aid $B_{FIN}$ in the final polishing composition satisfy the relation $D_{PRE}<D_{FIN}$. For instance, by suitably selecting the species of polishing aid, the relation $ORP_{PRE}>ORP_{FIN}$ can be satisfied with having the polishing aid concentrations in the respective compositions so that $D_{PRE}<D_{FIN}$. With certain species and combination of polishing aids satisfying the relation $D_{PRE}<D_{FIN}$ for the polishing aid concentrations and the relation $ORP_{PRE}>ORP_{FIN}$, higher levels of smoothness and flatness can be achieved on a super-hard surface. From the standpoint of achieving both smoothness and flatness, the ratio ($D_{PRE}/D_{FIN}$) of the concentration $D_{PRE}$ of the polishing aid $B_{PRE}$ in the preliminary polishing composition to the concentration $D_{FIN}$ of the polishing aid $B_{FIN}$ in the final polishing composition is preferably 0.05 to 10.0, more preferably 0.1 to 1.0, or yet more preferably 0.15 to 0.8.

(2-2-3. Other Components)

As long as the effects of the present invention are not impaired, the preliminary polishing composition according to the second aspect disclosed herein may further comprise, as necessary known additives that can be used in polishing compositions (typically polishing compositions for super-hard materials, e.g. polishing compositions for silicon carbide substrates), such as chelating agent, thickener, dispersing agent, pH-adjusting agent, surfactant, organic acids, organic acid salts, inorganic acids, inorganic acid salts, anti-corrosive, preservative, and antifungal agent. The amounts of the additives contained can be suitably selected in accordance with their purposes and do not characterize the present invention; and therefore, details are omitted.

(2-2-4. Solvent)

As the solvent used in the preliminary polishing composition according to the second aspect disclosed herein, the same species of solvent described with respect to the preliminary polishing composition according to the first aspect can be used.

The preliminary polishing composition according to the second aspect disclosed herein is not particularly limited in pH as long as the preliminary polishing composition satisfies the relation to the final polishing composition described later with respect to the oxidation-reduction potential. The pH of the preliminary polishing composition is usually suitably about 2 to 12. The preliminary polishing composition having a pH value in this range is likely to achieve practical polishing efficiency. The preliminary polishing composition has a pH value of preferably 6 to 10, or more preferably 8.5 to 9.5. The pH of the preliminary polishing composition is preferably higher than that of the final polishing composition. This can give rise to a beneficial difference in oxidation-reduction potential between the preliminary polishing composition and the final polishing composition, whereby both smoothness and flatness can be more preferably achieved on a super-hard surface. In a preferable embodiment, the pH of the preliminary polishing composition is higher than that of the final polishing composition by at least 1.0 (preferably by at least 2.0).

The method for preparing the preliminary polishing composition disclosed herein is not particularly limited. For instance, the respective components of the preliminary polishing composition may be mixed with a known mixing device such as a propeller stirrer, ultrasonic disperser, and homo mixer. The mode of mixing these components is not particularly limited. For instance, all the components can be mixed at once or in a suitably prescribed order.

<2-3. Final Polishing Composition>

(2-3-0. Oxidation-Reduction Potential $ORP_{FIN}$)

The final polishing composition according to the second aspect has a lower oxidation-reduction potential than the preliminary polishing composition. In other words, the oxidation-reduction potential $ORP_{PRE}$ vs. standard hydrogen electrode of the preliminary polishing composition and the oxidation-reduction potential $ORP_{FIN}$ vs. standard hydrogen electrode of the final polishing composition satisfy the relation $ORP_{PRE} > ORP_{FIN}$. This can increase the smoothness, thereby for instance, inhibiting the occurrence of scratches (surface defects) on the surface of the object polished with the final polishing composition. In particular, from the standpoint of increasing the smoothness, the oxidation-reduction potential $ORP_{FIN}$ of the final polishing composition is preferably 650 mV or lower, more preferably 600 mV or lower, or yet more preferably 500 mV or lower. The minimum oxidation-reduction potential $ORP_{FIN}$ of the final polishing composition is not particularly limited. From the standpoint of achieving both smoothness and flatness, it is preferably 300 mV or higher, more preferably 400 mV or higher, or yet more preferably 440 mV or higher.

Similarly to the preliminary polishing composition described earlier, the final polishing composition's oxidation-reduction potential $ORP_{FIN}$ can be adjusted to the suitable range while satisfying the suitable relation disclosed herein, by suitably selecting the species of polishing aid and its concentration in the final polishing composition as well as the pH of the composition, etc.

(2-3-1. Abrasive $A_{FIN}$)

The final polishing composition according to the second aspect disclosed herein preferably comprises an abrasive $A_{FIN}$. As the abrasive $A_{FIN}$ in the final polishing composition according to the second aspect, the same species of abrasive $A_{FIN}$ described with respect to the final polishing composition according to the first aspect can be used.

The hardness of the abrasive $A_{FIN}$ is not particularly limited, but is preferably lower than the abrasive $A_{PRE}$ used in preliminary polishing. This can efficiently increase the smoothness. In particular, from the standpoint of bringing about both smoothness and flatness, the abrasive $A_{FIN}$ has a Vickers hardness of preferably 200 Hv or higher, more preferably 400 Hv or higher, or yet more preferably 600 Hv or higher. The maximum Vickers hardness of the abrasive $A_{FIN}$ is not particularly limited. From the standpoint of increasing the smoothness, it is preferably 1500 Hv or lower, more preferably 1000 Hv or lower, or yet more preferably 800 Hv or lower.

The mean secondary particle diameter of the abrasive $A_{FIN}$ is not particularly limited. From the standpoint of the polishing efficiency it is preferably 20 nm or larger, more preferably 70 nm or larger, or yet more preferably 90 nm or larger. From the standpoint of obtaining a smoother surface, the mean secondary particle diameter of the abrasive $A_{FIN}$ is suitably 500 nm or smaller, preferably 300 nm or smaller, more preferably 200 nm or smaller, yet more preferably 130 nm or smaller, or particularly preferably 110 nm or smaller.

From the standpoint of the polishing efficiency the abrasive concentration $C_{FIN}$ in the final polishing composition is usually suitably 3% by weight or higher. From the standpoint of efficiently increasing the smoothness, the abrasive concentration $C_{FIN}$ is preferably 10% by weight or higher, or more preferably 20% by weight or higher. From the standpoint of efficiently achieving high levels of both smoothness and flatness, the abrasive concentration $C_{FIN}$ in the final polishing composition is usually suitably 50% by weight or lower, preferably 40% by weight or lower, or more preferably 30% by weight or lower.

(2-3-2. Polishing Aid $B_{FIN}$)

The final polishing composition according to the second aspect disclosed herein preferably comprises a polishing aid $B_{FIN}$. The polishing aid $B_{FIN}$ is a component that enhances the effects of final polishing, and a water-soluble species is typically used. Similarly to the polishing aid $B_{PRE}$ in the aforementioned preliminary polishing, the polishing aid $B_{FIN}$ is thought to contribute to the polishing efficiency and the surface quality (especially an increase in smoothness) of the polished object, by working to alter (typically oxidize) the polished surface in the final polishing and bring about embrittlement of the polished surface, but is not particularly limited to this.

The species of polishing aid $B_{FIN}$ is not particularly limited as long as the final polishing composition satisfies the relation to the preliminary polishing composition with respect to the oxidation-reduction potential. For instance, as the polishing aid $B_{FIN}$, one, two or more species can be preferably used among the examples of the polishing aid $B_{PRE}$. Among them, vanadic acid or a salt thereof, an iodine compound, molybdic acid or a salt thereof, and tungstic acid or a salt thereof are preferable. Sodium vanadate and potassium vanadate are particularly preferable. The use of these compounds as the polishing aid $B_{FIN}$ can efficiently increase the smoothness.

In a preferable embodiment, the final polishing composition comprises a composite metal oxide as the polishing aid $B_{FIN}$. Examples of the composite metal oxide include metal nitrates, ferrates, permanganates, chromates, vanadates, ruthenates, molybdates, rhenates and tungstates. In particular, vanadates, molybdates and tungstates are more preferable; vanadates are even more preferable.

In a more preferable embodiment, as the composite metal oxide, a composite metal oxide $CMO_{FIN}$ is used, with the composite metal oxide having a monovalent or divalent metal (but not a transition metal) or ammonia, and a transition metal in group 5 or group 6 of the periodic table. The inclusion of such a composite metal oxide $CMO_{FIN}$ as the polishing aid $B_{FIN}$ can efficiently increase the smoothness. Favorable examples of the monovalent or divalent metal (but not a transition metal) or ammonia include Na, K, Mg, Ca and ammonia. Among them, Na and K are more preferable. The transition metal in group 5 or group 6 of the periodic table is selected preferably among the elements in the fourth, fifth and sixth periods; more preferably among the elements in the fourth and fifth periods; or yet more preferably among the elements in the fourth period. The transition metal is preferably selected among group 5 elements. Specific examples include V, Nb, Ta, Cr, Mo, and W In particular, V, Mo and W are more preferable, and V is yet more preferable.

When the final polishing composition disclosed herein comprises a composite metal oxide (preferably a composite metal oxide $CMO_{FIN}$) as the polishing aid $B_{FIN}$, it is preferable that, as other polishing aid $B_{FIN}$ besides the composite metal oxide, it further comprises an oxygen-containing substance capable of supplying oxygen to the composite metal oxide (preferably a composite metal oxide $CMO_{FIN}$). By this, the composite metal oxide $CMO_{FIN}$ (preferably a composite metal oxide $CMO_{FIN}$) works to continuously produce chemical effects, whereby the polishing efficiency of the final polishing can significantly increase and high levels of both smoothness and flatness can be obtained with super-hard materials. Favorable examples of the oxygen-containing substance include hydrogen peroxide, ozone, and peracids. Among them, hydrogen peroxide is particularly preferable.

The concentration $D_{FIN}$ of the polishing aid $B_{FIN}$ in the final polishing composition is not particularly limited as long as the final polishing composition satisfies the relation to the preliminary polishing composition with respect to the oxidation-reduction potential. The concentration $D_{FIN}$ is usually suitably 0.1% by weight or higher. From the standpoint of efficiently obtaining high levels of both smoothness and flatness, the polishing aid concentration $D_{FIN}$ is preferably 0.5% by weight or higher, or more preferably 1% by weight or higher (e.g. 1.5% by weight or higher). From the standpoint of increasing the smoothness, the concentration $D_{FIN}$ of the polishing aid $B_{FIN}$ is usually suitably 15% by weight or lower, preferably 10% by weight or lower, or more preferably 5% by weight or lower (e.g. 3% by weight or lower, or 2.5% by weight or lower).

As for the polishing aid $B_{FIN}$, when using both a composite metal oxide (preferably a composite metal oxide $CMO_{FIN}$) and an oxygen-containing substance capable of supplying oxygen to the metal oxide, the concentration of the composite metal oxide is usually suitably 0.1% by weight or higher. From the standpoint of efficiently obtaining high levels of smoothness and flatness together, the composite metal oxide concentration is preferably 0.5% by weight or higher, or more preferably 1.5% by weight or higher. From the standpoint of increasing the smoothness, the composite metal oxide concentration is usually suitably 10% by weight or lower, preferably 3% by weight or lower, or more preferably 2.5% by weight or lower. In this embodiment, the concentration of the oxygen-containing substance is usually suitably 0.1% to 10% by weight; from the standpoint of preferably obtaining oxygen supplies, the concentration of the oxygen-containing substance is preferably 0.5% to 3% by weight, or more preferably 1% to 2% by weight.

The final polishing composition according to the second aspect disclosed herein is not particularly limited in pH as long as the final polishing composition satisfies the relation to the preliminary polishing composition with respect to the oxidation-reduction potential. The pH of the final polishing composition is usually suitably about 2 to 12. The final polishing composition having a pH value in this range is likely to efficiently achieve excellent smoothness. The final polishing composition has a pH value of preferably 4 to 10, or more preferably 6 to 8.

With respect to other components and the solvent that can be used in the final polishing composition, the species that can be included in the preliminary polishing composition can be preferably used. Thus, their details are not repeated here. The final polishing composition can be prepared, for instance, by employing a similar method as the preparation method for the preliminary polishing composition or by making a suitable modification thereto based on technical common knowledge among those ordinarily skilled in the field.

<2-4. Polishing Composition Kit>

The art according to the second aspect disclosed herein may include providing a polishing composition kit as following: Similarly to the polishing composition kit according to the first aspect, the art according to the second aspect disclosed herein provides a polishing composition kit comprising a preliminary polishing composition and a final polishing composition which are stored separately.

<2-5. Polishing Composition>

The polishing method according to the second aspect disclosed herein comprises a step of carrying out preliminary polishing (a preliminary polishing step), and a step of carrying out final polishing (a final polishing step). The preliminary polishing step is a step where an object formed of a material having a Vickers hardness of 1500 Hv or higher at least on the surface (a surface to be polished) is subjected to preliminary polishing using a preliminary polishing composition. The final polishing step is a step where the preliminarily polished object is subjected to final polishing using a final polishing composition. In this polishing method, the oxidation-reduction potential $ORP_{PRE}$ vs. standard hydrogen electrode of the preliminary polishing composition and the oxidation-reduction potential $ORP_{FIN}$ vs. standard hydrogen electrode of the final polishing composition satisfy the relation $ORP_{PRE} > ORP_{FIN}$.

When the preliminary polishing step is a multi-stage polishing step including two or more stages, the later (i.e. the more downstream) the stage is, the more preferable it is to use a preliminary polishing composition having a relatively lower oxidation-reduction potential vs. standard hydrogen electrode. This can achieve higher levels of both smoothness and flatness on a super-hard surface. Otherwise, the polishing method according to the second aspect can be practiced mostly in the same manner as according to the first aspect, so their details are not repeated.

<<3. Third Aspect>>

The polishing method according to the third aspect disclosed herein comprises a step of carrying out preliminary polishing (a preliminary polishing step) using a preliminary polishing composition and a step of carrying out final polishing (a final polishing step) using a final polishing composition. Hereinafter, the object to be polished, the standard polishing removal rate, the preliminary polishing composition, the final polishing composition, and the polishing method are described in this order.

<3-1. Objects to be Polished>

The polishing method according to the third aspect disclosed herein is a method for polishing a material having a Vickers hardness of 1500 Hv or higher (or a super-hard material). The polishing method according to the third aspect disclosed herein can bring about both smoothness and flatness on a surface of such a super-hard material. As for the super-hard material (the Vickers hardness and the material) according to the third aspect, the same kinds of super-hard materials described with respect to the polishing method according to the first aspect can be used.

<Standard Polishing Removal Rate>

In the present description, the standard polishing removal rate of each polishing composition is the value determined based on the next equation by using the polishing composition as is as the polishing slurry and subjecting it to a standard polishing test carried out under the conditions described below:

> Standard polishing removal rate (nm/h)=decrease in weight (g) of SiC wafer upon polishing÷(polished area of SiC wafer (cm²)(=19.62 cm²)× density of SiC (g/cm³) (=3.21 g/cm³)×time of polishing (h)(=1 h)×10⁻⁷)

[Polishing Conditions]

Polishing machine: single-face polishing machine, model EJ-380IN, available from Engis Japan Corporation Polishing pad: trade name SUBA800 available from Nitta Haas Inc.

Polishing pressure: 300 g/cm²
Platen rotational speed: 80 rpm
Head rotational speed: 40 rpm
Polishing time: 1 hour (h)
Flow rate of polishing slurry: 20 mL/min (flow-through)
Temperature of polishing slurry: 25° C.
Polished object: SiC wafer (n-type conduction, crystal type: 4H 4° off) 2 inches <3-2. Preliminary Polishing Composition>

(3-2-0. Polishing Removal Rate $R_{PRE}$)

The preliminary polishing composition according to the third aspect has a higher standard polishing removal rate on a SiC wafer than the final polishing composition described later. In other words, the preliminary polishing composition's standard polishing removal rate $R_{PRE}$ on the SiC wafer based on the standard polishing test and the final polishing composition's standard polishing removal rate $R_{FIN}$ on the SiC wafer based on the standard polishing test satisfy the relation $R_{PRE}>R_{FIN}$. This can increase the flatness, thereby for instance, reducing the surface roughness over the entire object polished with the preliminary polishing composition.

In particular, the ratio ($R_{PRE}/R_{FIN}$) of the standard polishing removal rate $R_{PRE}$ of the preliminary polishing composition to the standard polishing removal rate $R_{FIN}$ of the final polishing composition described later is higher than 1. From the standpoint of achieving both smoothness and flatness, the $R_{PRE}/R_{FIN}$ ratio is preferably 1.5 to 5.0, more preferably 1.8 to 4.0, yet more preferably 2.0 to 3.0, or particularly preferably 2.2 to 2.8. When the standard polishing removal rate ratio ($R_{PRE}/R_{FIN}$) is 1.5 or higher the flatness of the polished surface will increase further. When the standard polishing removal rate ratio ($R_{PRE}/R_{FIN}$) is 5.0 or lower, higher levels of both smoothness and flatness can be obtained on a super-hard surface.

The standard polishing removal rate $R_{PRE}$ of the preliminary polishing composition is not particularly limited as long as it satisfies the relation to the standard polishing removal rate $R_{FIN}$ of the final polishing composition described later. From the standpoint of reducing the machining time, $R_{PRE}$ is preferably 600 nm/h or higher, more preferably 650 nm/h or higher, or yet more preferably 700 nm/h or higher. The maximum polishing removal rate $R_{PRE}$ of the preliminary polishing composition is not particularly limited. From the standpoint of achieving both smoothness and flatness, it is preferably 2000 nm/h or lower, more preferably 1500 nm/h or lower, yet more preferably 1200 nm/h or lower, or further more preferably 900 nm/h or lower. From the standpoint of combining greater smoothness and flatness, the preliminary polishing composition's standard polishing removal rate $R_{PRE}$ is preferably greater than the final polishing composition's polishing removal rate $R_{FIN}$ by at least 300 nm/h, or more preferably by at least 400 nm/h (e.g. by at least 450 nm/h). The preliminary polishing composition's standard polishing removal rate $R_{PRE}$ minus the final polishing composition's polishing removal rate $R_{FIN}$ is preferably 800 nm/h or less, more preferably 600 nm/h or less, or yet more preferably 500 nm/h or less.

The preliminary polishing composition's standard polishing removal rate $R_{PRE}$ can be adjusted, for instance, by changing the material and the properties (e.g. the hardness and/or the mean secondary particle diameter) of the abrasive in the preliminary polishing composition. In general, with increasing hardness and/or mean secondary particle diameter of the abrasive, the polishing removal rate tends to increase. Thus, by suitably selecting the hardness and/or the mean secondary particle diameter of the abrasive in the preliminary polishing composition, the standard polishing removal rate $R_{PRE}$ of the preliminary polishing composition can be adjusted to the suitable range while satisfying the suitable relation disclosed herein. As for the method for adjusting the standard polishing removal rate $R_{PRE}$ of the preliminary polishing composition to the suitable range while satisfying the suitable relation, it is possible to employ methods such as changing the abrasive concentration in the composition, changing the species of polishing aid and its concentration, and changing the pH of the composition. For controlling the standard polishing removal rate $R_{PRE}$, solely one method or a combination of two or more methods can be used.

(3-2-1. Abrasive $A_{PRE}$)

The preliminary polishing composition according to the third aspect disclosed herein comprises an abrasive $A_{PRE}$. The material and the properties of the abrasive $A_{PRE}$ are not particularly limited as long as the preliminary polishing composition satisfies the relation to the final polishing composition described later with respect to the standard polishing removal rate. For instance, the abrasive $A_{PRE}$ may be inorganic particles, organic particles, or inorganic/organic composite particles. Examples include an abrasive substantially formed of any of the following: oxide particles such as silica particles, alumina particles, cerium oxide particles, chromium oxide particles, titanium dioxide particles, zirconium oxide particles, magnesium oxide particles, manganese dioxide particles, zinc oxide particles, and iron oxide particles; nitride particles such as silicon nitride particles and boron nitride particles; carbide particles such as silicon carbide particles and boron carbide particles; diamond particles; and carbonates such as calcium carbonate and barium carbonate. For the abrasive, solely one species or a combination of two or more species can be used. In particular, particles oxides are preferable, such as silica particles, alumina particles, cerium oxide particles, chromium oxide particles, zirconium oxide particles, manganese dioxide particles, and iron oxide particles, because they can form fine surfaces. Among them, alumina particles, zirconium oxide particles, chromium oxide particles and iron oxide particles are more preferable; and alumina particles are particularly preferable.

As used herein, with respect to the composition of an abrasive, "substantially consisting of X" or being "substantially formed of X" means that the ratio of X in the abrasive (or the purity of X) is 90% or higher (preferably 95% or higher, more preferably 97% or higher, or yet more preferably 98% or higher, e.g. 99% or higher) by weight.

When alumina particles are used as the abrasive $A_{PRE}$, in general, the higher the alumina particle content is in the total abrasive $A_{PRE}$ in the preliminary polishing composition, the more advantageous it is. For instance, the alumina particle content in the total abrasive $A_{PRE}$ in the preliminary polishing composition is preferably 70% by weight or higher, more preferably 90% by weight or higher, yet more preferably 95% by weight or higher (e.g. 95% to 100% by weight).

The preliminary polishing composition disclosed herein is preferably substantially free of diamond particles as the abrasive $A_{PRE}$. Because of the super hardness, diamond particles can be a limiting factor in increasing the flatness. In addition, diamond particles are generally expensive and thus are not considered advantageous in terms of cost performance. In practical aspects, it is desirable to be less dependent on expensive materials such as diamond particles.

From the standpoint of increasing the flatness, the abrasive $A_{PRE}$'s Vickers hardness is preferably 800 Hv or higher, more preferably 1200 Hv or higher, or yet more preferably 1500 Hv or higher. The maximum Vickers hardness of the abrasive $A_{PRE}$ is not particularly limited. From the standpoint of achieving both smoothness and flatness, it is preferably 3000 Hv or lower, more preferably 2000 Hv or lower, or yet more preferably 1700 Hv or lower. In the present description, for the Vickers hardness of an abrasive, the value determined based on JIS R 1610:2003 with respect to the material used as the abrasive is used.

The abrasive $A_{PRE}$'s Vickers hardness is preferably equal to or lower than the Vickers hardness of the material forming the surface of the object to be polished (i.e. the material subject to polishing). Because the hardness of the abrasive $A_{PRE}$ is limited in relation to the hardness of the material to be polished, degradation of flatness tends to be inhibited. The Vickers hardness of the abrasive $A_{PRE}$ is preferably lower than that of the material to be polished by at least 300 Hv (e.g. at least 500 Hv). From the standpoint of increasing the flatness, the difference in Vickers hardness between the abrasive $A_{PRE}$ and the material to be polished is preferably 1000 Hv or less (e.g. 800 Hv or less). This tends to preferably bring about both smoothness and flatness.

The abrasive $A_{PRE}$ is preferably harder than the abrasive $A_{FIN}$ used in the final polishing described later. For instance, it is preferable that the abrasive $A_{PRE}$ in the preliminary polishing composition has a Vickers hardness $H_{PRE}$ and the abrasive $A_{FIN}$ in the final polishing composition has a Vickers hardness $H_{FIN}$, satisfying the relation $H_{PRE} > H_{FIN}$. This can effectively increase the standard polishing removal rate $R_{PRE}$ of the preliminary polishing composition to further increase the flatness. In particular, the ratio ($H_{PRE}/H_{FIN}$) of the abrasive $A_{PRE}$'s Vickers hardness $H_{PRE}$ to the abrasive $A_{FIN}$'s Vickers hardness $H_{FIN}$ is greater than 1. From the standpoint of efficiently achieving both smoothness and flatness, it is preferably 1.3 to 4.0, more preferably 1.8 to 3.0, or yet more preferably 2.1 to 2.5.

The abrasive $A_{PRE}$ usually has a mean secondary particle diameter of 20 nm or larger. From the standpoint of increasing the flatness, it is preferably 100 nm or larger, more preferably 200 nm or larger (e.g. 400 nm or larger). The abrasive $A_{PRE}$ with such a mean secondary particle diameter can effectively increase the standard polishing removal rate $R_{PRE}$ of the preliminary polishing composition, thereby achieving excellent flatness more efficiently. From the standpoint of obtaining a sufficient number of particles per unit weight, the maximum mean secondary particle diameter of the abrasive $A_{PRE}$ is suitably about 5000 nm or smaller. From the standpoint of combining higher levels of smoothness and flatness, the mean secondary particle diameter is preferably 3000 nm or smaller, or more preferably 2000 nm or smaller (e.g. 800 nm or smaller).

With respect to the abrasive $A_{PRE}$'s mean secondary particle diameter, for particles smaller than 500 nm, it can be determined as the volume mean particle diameter (arithmetic mean diameter by volume, Mv) by dynamic light scattering, using, for instance, model UPA-UT151 available from Nikkiso Co., Ltd.; for particles of 500 nm or larger, it can be determined as the volume mean particle diameter by pore electrical resistance, etc., using model MULTISIZER 3 available from Beckman Coulter Inc.

The mean secondary particle diameter $P_{PRE}$ of the abrasive $A_{PRE}$ is preferably larger than the mean secondary particle diameter $P_{FIN}$ of the abrasive $A_{FIN}$ used in the final polishing described later. That is, the mean secondary particle diameter $P_{PRE}$ of the abrasive $A_{PRE}$ in the preliminary polishing composition and the mean secondary particle diameter $P_{FIN}$ of the abrasive $A_{FIN}$ in the final polishing composition preferably satisfy the relation $P_{PRE} > P_{FIN}$. This can give rise to a beneficial difference in standard polishing removal rate between the preliminary polishing composition and the final polishing composition to more preferably combine smoothness and flatness on a super-hard surface. In a preferable embodiment, the ratio ($P_{PRE}/P_{FIN}$) of the mean secondary particle diameter $P_{PRE}$ of the abrasive $A_{PRE}$ to the mean secondary particle diameter $P_{FIN}$ of the abrasive $A_{FIN}$ is about 1.0 to 20. From the standpoint of efficiently achieving smoothness and flatness together, the ratio ($P_{PRE}/P_{FIN}$) is preferably 2.0 to 10, or more preferably 4.0 to 6.0.

From the standpoint of the polishing efficiency the concentration $C_{PRE}$ of the abrasive in the preliminary polishing composition is usually suitably 1% by weight or higher. From the standpoint of increasing the flatness, the abrasive concentration is preferably 3% by weight or higher, or more preferably 5% by weight or higher. In view of efficiently achieving high levels of both smoothness and flatness and in view of obtaining good dispersibility the abrasive concentration $C_{PRE}$ in the preliminary polishing composition is usually suitably 50% by weight or lower, preferably 20% by weight or lower, more preferably 10% by weight or lower, or yet more preferably 8% by weight or lower.

In a preferable embodiment, the abrasive concentration $C_{PRE}$ in the preliminary polishing composition is higher than the abrasive concentration $C_{FIN}$ in the final polishing composition described later. That is, the abrasive concentration $C_{PRE}$ in the preliminary polishing composition and the abrasive concentration $C_{FIN}$ in the final polishing composition satisfy the relation $C_{PRE} > C_{FIN}$. This can effectively increase the standard polishing removal rate $R_{PRE}$ of the preliminary polishing composition to further increase the flatness.

In another preferable embodiment, the abrasive concentration $C_{PRE}$ in the preliminary polishing composition is lower than the abrasive concentration $C_{FIN}$ in the final polishing composition described later. That is, the abrasive concentration $C_{PRE}$ in the preliminary polishing composition and the abrasive concentration $C_{FIN}$ in the final polishing composition satisfy the relation $C_{PRE} < C_{FIN}$. For instance, by suitably selecting the hardness and/or the mean secondary particle diameter of the abrasive, the relation $R_{PRE} > R_{FIN}$ can be satisfied while having the abrasive concentrations in the respective compositions so that $C_{PRE} < C_{FIN}$. With certain hardness of the abrasive and/or certain mean secondary particle diameter thereof, the relation $C_{PRE} < C_{FIN}$ of the abrasive concentrations and the relation $R_{PRE} > R_{FIN}$ are satisfies, whereby higher levels of both smoothness and flatness can be obtained on a super-hard surface. From the standpoint of achieving both smoothness and flatness, the ratio ($C_{PRE}/C_{FIN}$) of the abrasive concentration $C_{PRE}$ of the preliminary polishing composition to the abrasive concentration $C_{FIN}$ of the final polishing composition is preferably 0.1 to 10.0, more preferably 0.15 to 1.0, or yet more preferably 0.2 to 0.5.

(3-2-2. Polishing Aid $B_{PRE}$)

The preliminary polishing composition according to the third aspect disclosed herein preferably comprises a polishing aid $B_{PRE}$. As the polishing aid $B_{PRE}$ in the preliminary polishing composition according to the third aspect, the same species of polishing aid $B_{PRE}$ described with respect to the preliminary polishing composition according to the first aspect can be used.

The concentration of the polishing aid $B_{PRE}$ in the preliminary polishing composition is usually suitably 0.1% by weight or higher. From the standpoint of increasing the flatness, the polishing aid concentration is preferably 0.5% by weight or higher, or more preferably 1% by weight or higher. From the standpoint of obtaining high levels of both smoothness and flatness, the concentration of the polishing aid $B_{PRE}$ is usually suitably 10% by weight or lower, preferably 3% by weight or lower, or more preferably 2% by weight or lower.

(3-2-3. Other Components)

As long as the effects of the present invention are not impaired, the preliminary polishing composition according to the third aspect disclosed herein may further comprise, as necessary known additives that can be used in polishing compositions (typically polishing compositions for superhard materials, e.g. polishing compositions for silicon carbide substrates), such as chelating agent, thickener, dispersing agent, pH-adjusting agent, surfactant, organic acids, organic acid salts, inorganic acid, inorganic acid salts, anticorrosive, preservative, and antifungal agent. The amounts of the additives contained can be suitably selected in accordance with their purposes and do not characterize the present invention; and therefore, details are omitted.

(3-2-4. Solvent)

As the solvent used in the preliminary polishing composition according to the third aspect disclosed herein, the same species of solvent described with respect to the preliminary polishing composition according to the first aspect can be used.

The preliminary polishing composition according to the third aspect disclosed herein is not particularly limited in pH as long as the preliminary polishing composition satisfies the relation to the final polishing composition described later with respect to the standard polishing removal rate. The pH of the preliminary polishing composition is usually suitably about 2 to 12. The preliminary polishing composition having a pH value in this range is likely to achieve practical polishing efficiency. The preliminary polishing composition has a pH value of preferably 6 to 10, or more preferably 8.5 to 9.5. The pH of the preliminary polishing composition is preferably higher than that of the final polishing composition. This can give rise to a beneficial difference in standard polishing removal rate between the preliminary polishing composition and the final polishing composition, whereby both smoothness and flatness can be more preferably achieved on a super-hard surface. In a preferable embodiment, the pH of the preliminary polishing composition is higher than that of the final polishing composition by at least 1.0 (preferably by at least 2.0).

The method for preparing the preliminary polishing composition disclosed herein is not particularly limited. For instance, the respective components of the preliminary polishing composition may be mixed with a known mixing device such as a propeller stirrer, ultrasonic disperser, and homo mixer. The mode of mixing these components is not particularly limited. For instance, all the components can be mixed at once or in a suitably prescribed order.

<3-3. Final Polishing Composition>

(3-3-0. Polishing Removal Rate $R_{FIN}$)

The final polishing composition according to the third aspect has a lower standard polishing removal rate on a SiC wafer than the preliminary polishing composition. In other words, the standard polishing removal rate $R_{PRE}$ on the SiC wafer of the preliminary polishing composition and the standard polishing removal rate $R_{FIN}$ on the SiC wafer of the final polishing composition satisfy the relation $R_{PRE} > R_{FIN}$. This can increase the smoothness, thereby for instance, inhibiting the occurrence of scratches (surface defects) on the surface of the object polished with the final polishing composition. In particular, from the standpoint of increasing the smoothness, the standard polishing removal rate $R_{FIN}$ of the final polishing composition is preferably 700 nm/h or lower, more preferably 500 nm/h or lower, or yet more preferably 400 nm/h or lower. The minimum standard polishing removal rate $R_{FIN}$ of the final polishing composition is not particularly limited. From the standpoint of achieving both smoothness and flatness, it is preferably 100 nm/h or higher, more preferably 200 nm/h or higher, yet more preferably 300 nm/h or higher.

The standard polishing removal rate $R_{FIN}$ of the final polishing composition can be determined based on the standard polishing test. Similarly to the preliminary polishing composition described earlier, the final polishing composition's standard polishing removal rate $R_{FIN}$ can be adjusted to the suitable range while satisfying the suitable relation disclosed herein, by suitably selecting the material and the properties (e.g. the hardness and/or the mean secondary particle diameter) of the abrasive in the final polishing composition, the abrasive concentration in the composition, the species of polishing aid and its concentration, and the pH of the composition.

(3-3-1. Abrasive $A_{FIN}$)

The final polishing composition according to the third aspect disclosed herein preferably comprises an abrasive $A_{FIN}$. The material and properties of the abrasive $A_{FIN}$ are not particularly limited as long as the final polishing composition satisfies the relation to the preliminary polishing composition with respect to the standard polishing removal rate. For instance, the abrasive $A_{FIN}$ can be inorganic particles, organic particles, or organic-inorganic composite particles. As the abrasive $A_{FIN}$, one, two or more species can be preferably used among the examples of the abrasive $A_{PRE}$. Among them, oxide particles are more preferable, such as silica particles, alumina particles, cerium oxide particles, chromium oxide particles, zirconium oxide particles, manganese dioxide particles, iron oxide particles, and magnesium oxide particles; silica particles, cerium oxide particles, and manganese dioxide particles are yet more preferable; silica particles are particularly preferable.

The silica particles include colloidal silica, fumed silica and precipitated silica. From the standpoint of increasing the smoothness, colloidal silica and fumed silica are preferable. In particular, colloidal silica is especially preferable.

When silica particles are used as the abrasive $A_{FIN}$, in general, the higher the silica particle content is in the total abrasive $A_{FIN}$ in the final polishing composition, the more advantageous it is. For instance, the silica particle content of the total abrasive $A_{FIN}$ in the final polishing composition is preferably 70% by weight or higher, more preferably 90% by weight or higher, or yet more preferably 95% by weight or higher (e.g. 95% to 100% by weight).

The hardness of the abrasive $A_{FIN}$ is not particularly limited as long as the final polishing composition satisfies the relation to the preliminary polishing composition with respect to the standard polishing removal rate. The abrasive $A_{FIN}$ is preferably lower in hardness than the abrasive $A_{PRE}$ used in preliminary polishing. This can effectively decrease the standard polishing removal rate $R_{FIN}$ of the final polishing composition to efficiently increase the smoothness. In particular, from the standpoint of bringing about both smoothness and flatness, the abrasive $A_{FIN}$ has a Vickers hardness of preferably 200 Hv or higher, more preferably 400 Hv or higher, or yet more preferably 600 Hv or higher. The maximum Vickers hardness of the abrasive $A_{FIN}$ is not particularly limited. From the standpoint of increasing the smoothness, it is preferably 1500 Hv or lower, more preferably 1000 Hv or lower, or yet more preferably 800 Hv or lower.

The mean secondary particle diameter of the abrasive $A_{FIN}$ is not particularly limited as long as the final polishing composition satisfies the relation to the preliminary polishing composition with respect to the standard polishing removal rate. From the standpoint of the polishing efficiency it is preferably 20 nm or larger, more preferably 70 nm or larger, or yet more preferably 90 nm or larger. From the standpoint of obtaining a smoother surface, the mean secondary particle diameter of the abrasive $A_{FIN}$ is suitably 500 nm or smaller, preferably 300 nm or smaller, more preferably 200 nm or smaller, yet more preferably 130 nm or smaller, or particularly preferably 110 nm or smaller.

From the standpoint of the polishing efficiency the abrasive concentration $C_{FIN}$ in the final polishing composition is usually suitably 3% by weight or higher. From the standpoint of efficiently increasing the smoothness, the abrasive concentration $C_{FIN}$ is preferably 10% by weight or higher, or more preferably 20% by weight or higher. From the standpoint of efficiently achieving high levels of both smoothness and flatness, the abrasive concentration $C_{FIN}$ in the final polishing composition is usually suitably 50% by weight or lower, preferably 40% by weight or lower, or more preferably 30% by weight or lower.

(3-3-2. Polishing Aid $B_{FIN}$)

The final polishing composition according to the third aspect disclosed herein preferably comprises a polishing aid $B_{FIN}$. As the polishing aid $B_{FIN}$ in the preliminary polishing composition according to the third aspect, the same species of polishing aid $B_{FIN}$ described with respect to the preliminary polishing composition according to the first aspect can be used.

The concentration of the polishing aid $B_{FIN}$ in the final polishing composition is usually suitably 0.1% by weight or higher. From the standpoint of efficiently obtaining high levels of both smoothness and flatness, the polishing aid concentration is preferably 0.5% by weight or higher, or more preferably 1% by weight or higher (e.g. 1.5% by weight or higher). From the standpoint of increasing the smoothness, the concentration of the polishing aid $B_{FIN}$ is usually suitably 15% by weight or lower, preferably 10% by weight or lower, or more preferably 5% by weight or lower (e.g. 3% by weight or lower, or 2.5% by weight or lower).

As for the polishing aid $B_{FIN}$, when using both a composite metal oxide (preferably a composite metal oxide $CMO_{FIN}$) and an oxygen-containing substance capable of supplying oxygen to the metal oxide, the concentration of the composite metal oxide is usually suitably 0.1% by weight or higher. From the standpoint of efficiently obtaining high levels of smoothness and flatness together, the composite metal oxide concentration is preferably 0.5% by weight or higher, or more preferably 1.5% by weight or higher. From the standpoint of increasing the smoothness, the composite metal oxide concentration is usually suitably 10% by weight or lower, preferably 3% by weight or lower, or more preferably 2.5% by weight or lower. In this embodiment, the concentration of the oxygen-containing substance is usually suitably 0.1% to 10% by weight; from the standpoint of preferably obtaining oxygen supplies, the concentration of the oxygen-containing substance is preferably 0.5% to 3% by weight, or more preferably 1% to 2% by weight.

The final polishing composition according to the third aspect disclosed herein is not particularly limited in pH as long as the final polishing composition satisfies the relation to the preliminary polishing composition with respect to the standard polishing removal rate. The pH of the final polishing composition is usually suitably about 2 to 12. The final polishing composition having a pH value in this range is likely to efficiently achieve excellent smoothness. The final polishing composition has a pH value of preferably 4 to 10, or more preferably 6 to 8.

With respect to other components and the solvent that can be used in the final polishing composition, the species that can be included in the preliminary polishing composition can be preferably used. Thus, their details are not repeated here. The final polishing composition can be prepared, for instance, by employing a similar method as the preparation method for the preliminary polishing composition or by making a suitable modification thereto based on technical common knowledge among those ordinarily skilled in the field.

<3-4. Polishing Composition Kit>

The art according to the third aspect disclosed herein may include, for instance, providing a polishing composition kit as following: Similarly to the polishing composition kit according to the first aspect, the art according to the third aspect disclosed herein provides a polishing composition kit comprising a preliminary polishing composition and a final polishing composition which are stored separately.

<3-5. Polishing Composition>

The polishing method according to the third aspect disclosed herein comprises a step of carrying out preliminary polishing (a preliminary polishing step), and a step of carrying out final polishing (a final polishing step). The preliminary polishing step is a step where an object formed of a material having a Vickers hardness of 1500 Hv or higher at least on the surface (a surface to be polished) is subjected to preliminary polishing using a preliminary polishing composition. The final polishing step is a step where the preliminarily polished object is subjected to final polishing using a final polishing composition. In this polishing method, the standard polishing removal rate $R_{PRE}$ on the SiC wafer of the preliminary polishing composition and the standard polishing removal rate $R_{FIN}$ on the SiC wafer of the final polishing composition satisfy the relation $R_{PRE} > R_{FIN}$.

When the preliminary polishing step is a multi-stage polishing step including two or more stages, the later (i.e. the more downstream) the stage is, the more preferable it is to use a preliminary polishing composition having a relatively lower standard polishing removal rate on a SiC wafer. This can achieve higher levels of both smoothness and flatness on a super-hard surface. Otherwise, the polishing method according to the third aspect can be practiced mostly in the same manner as according to the first aspect, so their details are not repeated.

Several working examples related to the present invention are described below, but the present invention is not limited to these examples. In the description below, "%" is by weight unless otherwise informed.

Experiment 1

Examples 1 to 34

(Preparation of Preliminary Polishing Compositions)

Were mixed an abrasive $A_{PRE}$, a polishing aid $B_{PRE}$ and deionized water to prepare each preliminary polishing slurry Tables 1 and 2 show the species of abrasive $A_{PRE}$ with their Vickers hardness (Hv) and mean secondary particle diameters (nm) and the species of polishing aid $B_{PRE}$ used in the respective examples as well as the compositions (concentrations of abrasive $A_{PRE}$ and polishing aid $B_{PRE}$) and the pH values of the preliminary polishing slurries according to the respective examples.

(Preparation of Final Polishing Compositions)

Were mixed an abrasive $A_{FIN}$, a polishing aid $B_{FIN}$ and deionized water to prepare each final polishing slurry Tables 1 and 2 show the species of abrasive $A_{FIN}$ with their Vickers hardness (Hv) and mean secondary particle diameters (nm) and the species of polishing aid $B_{FIN}$ used in the respective examples as well as the compositions (concentrations of abrasive $A_{FIN}$ and polishing aid $B_{FIN}$) and the pH values of the final polishing slurries according to the respective examples.

(Preliminary Polishing)

Using the preliminary polishing slurries obtained and a diamond abrasive having a mean particle diameter of 5 μm, surfaces of pre-lapped SiC wafers were subjected to preliminary polishing under the conditions shown below.

[Conditions of Preliminary Polishing]

Polishing machine: single-face polishing machine, model EJ-380IN, available from Engis Japan Corporation
Polishing pad: trade name SUBA800 available from Nitta Haas Inc.
Polishing pressure: 300 g/cm$^2$
Platen rotational speed: 80 rpm
Head rotational speed: 80 rpm
Flow rate of polishing slurry: 20 mL/min (flow-through)
Temperature of polishing slurry: 25° C.
Polished object: SiC wafer (n-type conduction, crystal type: 4H 4° off) 2 inches The time of preliminary polishing was one hour. In Example 33, preliminary polishing was carried out to uniform smoothness. In Example 34, preliminary polishing was not performed.

(Final Polishing)

Subsequently, using the final polishing slurries obtained, surfaces of the preliminarily-polished SiC wafers were subjected to final polishing under the conditions shown below.

[Conditions of Final Polishing]

Polishing machine: single-face polishing machine, model EJ-380IN, available from Engis Japan Corporation
Polishing pad: trade name SURFIN 019-3 available from Fujimi Incorporated
Polishing pressure: 300 g/cm$^2$
Platen rotational speed: 80 rpm
Head rotational speed: 80 rpm
Flow rate of polishing slurry: 20 mL/min (flow-through)
Temperature of polishing slurry: 25° C.
Polished object: SiC wafer (n-type conduction, crystal type: 4H 4° off) 2 inches Final polishing was carried out for as long as it took to uniform smoothness. In Example 33, final polishing was not performed.

<Flatness>

With respect to the polished surface of the object according to each Example, using a non-contact profilometer system (trade name NewView 5032 available from Zygo Corporation), the surface roughness value Ra (nm) was measured at 10× magnification over a measurement area of 700 μm×500 μm. The results are shown in Tables 1 and 2.

<Smoothness>

With respect to the polished surface of the object according to each Example, using an atomic force microscopy (AFM, trade name D3100 Nano Scope V available from Veeco Instruments, Inc.), the surface roughness value Ra (nm) was measured over a measurement area of 10 μm×10 μm. The results are shown in Tables 1 and 2.

<Polishing Time>

In Tables 1 and 2, the total time of polishing (the combined time of preliminary polishing and final polishing) in each Example is shown as a relative value with the total polishing time of Example 1 being 100. The larger the value is, the longer the polishing time is; the smaller the value is, the shorter the polishing time is.

TABLE 1

| | Ex. 1 | Ex. 2 | Ex. 3 | Ex. 4 | Ex. 5 | Ex. 6 | Ex. 7 | Ex. 8 | Ex. 9 |
|---|---|---|---|---|---|---|---|---|---|
| Preliminary polishing | | | | | | | | | |
| Abrasive | $Al_2O_3$ | $Al_2O_3$ | $Al_2O_3$ | $Al_2O_3$ | $Al_2O_3$ | $Al_2O_3$ | $Al_2O_3$ | $Al_2O_3$ | $Al_2O_3$ |
| $H_{PRE}$ (Hv) | 1600 | 1600 | 1600 | 1600 | 1600 | 1600 | 1600 | 1600 | 1600 |
| $P_{PRE}$ (nm) | 500 | 150 | 80 | 1300 | 2500 | 4000 | 500 | 500 | 500 |
| [Abrasive] (wt. %) | 6 | 6 | 6 | 6 | 6 | 6 | 3 | 10 | 6 |
| Polishing aid $B_{PRE}$ | $KMnO_4$ | $KMnO_4$ | $KMnO_4$ | $KMnO_4$ | $KMnO_4$ | $KMnO_4$ | $KMnO_4$ | $KMnO_4$ | $KMnO_4$ |
| [Polishing aid] (wt. %) | 1.2 | 1.2 | 1.2 | 1.2 | 1.2 | 1.2 | 1.2 | 1.2 | 0.6 |
| pH | 8.8 | 8.8 | 8.8 | 8.8 | 8.8 | 8.8 | 8.8 | 8.8 | 8.5 |
| Final polishing | | | | | | | | | |
| Abrasive | $SiO_2$ | $SiO_2$ | $SiO_2$ | $SiO_2$ | $SiO_2$ | $SiO_2$ | $SiO_2$ | $SiO_2$ | $SiO_2$ |
| $H_{FIN}$ (Hv) | 700 | 700 | 700 | 700 | 700 | 700 | 700 | 700 | 700 |
| $P_{FIN}$ (nm) | 97 | 97 | 97 | 97 | 97 | 97 | 97 | 97 | 97 |
| [Abrasive] (wt. %) | 23 | 23 | 23 | 23 | 23 | 23 | 23 | 23 | 23 |
| Polishing aid $B_{FIN}$-1 | $NaVO_3$ | $NaVO_3$ | $NaVO_3$ | $NaVO_3$ | $NaVO_3$ | $NaVO_3$ | $NaVO_3$ | $NaVO_3$ | $NaVO_3$ |
| [$B_{FIN}$-1] (wt. %) | 1.9 | 1.9 | 1.9 | 1.9 | 1.9 | 1.9 | 1.9 | 1.9 | 1.9 |
| Polishing aid $B_{FIN}$-2 | $H_2O_2$ | $H_2O_2$ | $H_2O_2$ | $H_2O_2$ | $H_2O_2$ | $H_2O_2$ | $H_2O_2$ | $H_2O_2$ | $H_2O_2$ |
| [$B_{FIN}$-2] (wt. %) | 1.2 | 1.2 | 1.2 | 1.2 | 1.2 | 1.2 | 1.2 | 1.2 | 1.2 |
| pH | 6.5 | 6.5 | 6.5 | 6.5 | 6.5 | 6.5 | 6.5 | 6.5 | 6.5 |
| $H_{PRE}/H_{FIN}$ | 2.3 | 2.3 | 2.3 | 2.3 | 2.3 | 2.3 | 2.3 | 2.3 | 2.3 |
| $P_{PRE}/P_{FIN}$ | 5.2 | 1.5 | 0.8 | 13.4 | 25.8 | 41.2 | 5.2 | 5.2 | 5.2 |

TABLE 1-continued

|  |  |  |  |  |  |  |  |  |  |
|---|---|---|---|---|---|---|---|---|---|
| Flatness Zygo Ra (nm) | 0.8 | 1.2 | 1.4 | 0.9 | 1.0 | 1.1 | 1.0 | 0.9 | 1.0 |
| Smoothness AFM Ra (nm) | 0.08 | 0.10 | 0.20 | 0.10 | 0.10 | 0.10 | 0.08 | 0.08 | 0.09 |
| Polishing time | 100 | 125 | 150 | 110 | 120 | 120 | 150 | 100 | 120 |

|  | Ex. 10 | Ex. 11 | Ex. 12 | Ex. 13 | Ex. 14 | Ex. 15 | Ex. 16 |
|---|---|---|---|---|---|---|---|
| Preliminary polishing |  |  |  |  |  |  |  |
| Abrasive | $Al_2O_3$ | $ZrO_2$ | $Cr_2O_3$ | $Al_2O_3$ | $Al_2O_3$ | $Al_2O_3$ | $Al_2O_3$ |
| $H_{PRE}$ (Hv) | 1600 | 1370 | 1200 | 1600 | 1600 | 1600 | 1600 |
| $P_{PRE}$ (nm) | 500 | 500 | 500 | 500 | 500 | 500 | 500 |
| [Abrasive] (wt. %) | 6 | 6 | 6 | 6 | 6 | 6 | 6 |
| Polishing aid $B_{PRE}$ | $KMnO_4$ | $KMnO_4$ | $KMnO_4$ | $K_2Cr_2O_7$ | $K_2FeO_4$ | $NaIO_4$ | $H_2O_2$ |
| [Polishing aid] (wt. %) | 2.4 | 1.2 | 1.2 | 1.2 | 1.2 | 1.2 | 1.2 |
| pH | 9.0 | 8.8 | 8.8 | 8.8 | 8.8 | 8.8 | 8.8 |
| Final polishing |  |  |  |  |  |  |  |
| Abrasive | $SiO_2$ | $SiO_2$ | $SiO_2$ | $SiO_2$ | $SiO_2$ | $SiO_2$ | $SiO_2$ |
| $H_{FIN}$ (Hv) | 700 | 700 | 700 | 700 | 700 | 700 | 700 |
| $P_{FIN}$ (nm) | 97 | 97 | 97 | 97 | 97 | 97 | 97 |
| [Abrasive] (wt. %) | 23 | 23 | 23 | 23 | 23 | 23 | 23 |
| Polishing aid $B_{FIN}$-1 | $NaVO_3$ | $NaVO_3$ | $NaVO_3$ | $NaVO_3$ | $NaVO_3$ | $NaIO_4$ | $NaVO_3$ |
| [$B_{FIN}$-1] (wt. %) | 1.9 | 1.9 | 1.9 | 1.9 | 1.9 | 1.9 | 1.9 |
| Polishing aid $B_{FIN}$-2 | $H_2O_2$ | $H_2O_2$ | $H_2O_2$ | $H_2O_2$ | $H_2O_2$ | — | $H_2O_2$ |
| [$B_{FIN}$-2] (wt. %) | 1.2 | 1.2 | 1.2 | 1.2 | 1.2 | — | 1.2 |
| pH | 6.5 | 6.5 | 6.5 | 6.5 | 6.5 | 6.5 | 6.5 |
| $H_{PRE}/H_{FIN}$ | 2.3 | 2.0 | 1.7 | 2.3 | 2.3 | 2.3 | 2.3 |
| $P_{PRE}/P_{FIN}$ | 5.2 | 5.2 | 5.2 | 5.2 | 5.2 | 5.2 | 5.2 |
| Flatness Zygo Ra (nm) | 1.0 | 1.2 | 1.2 | 1.3 | 1.3 | 1.5 | 1.5 |
| Smoothness AFM Ra (nm) | 0.10 | 0.09 | 0.09 | 0.10 | 0.10 | 0.13 | 0.11 |
| Polishing time | 110 | 170 | 180 | 140 | 140 | 150 | 160 |

TABLE 2

|  | Ex. 17 | Ex. 18 | Ex. 19 | Ex. 20 | Ex. 21 | Ex. 22 | Ex. 23 | Ex. 24 | Ex. 25 |
|---|---|---|---|---|---|---|---|---|---|
| Preliminary polishing |  |  |  |  |  |  |  |  |  |
| Abrasive | $Fe_3O_4$ | $Al_2O_3$ | $Al_2O_3$ | $Al_2O_3$ | $Al_2O_3$ | $Al_2O_3$ | $Al_2O_3$ | $Al_2O_3$ | $Al_2O_3$ |
| $H_{PRE}$ (Hv) | 500 | 1600 | 1600 | 1600 | 1600 | 1600 | 1600 | 1600 | 1600 |
| $P_{PRE}$ (nm) | 500 | 500 | 500 | 500 | 500 | 500 | 500 | 500 | 500 |
| [Abrasive] (wt. %) | 6 | 6 | 6 | 6 | 6 | 6 | 6 | 6 | 6 |
| Polishing aid $B_{PRE}$ | $KMnO_4$ | $KMnO_4$ | $KMnO_4$ | $KMnO_4$ | $KMnO_4$ | $KMnO_4$ | $KMnO_4$ | $KMnO_4$ | $KMnO_4$ |
| [Polishing aid] (wt. %) | 1.2 | 1.2 | 1.2 | 1.2 | 1.2 | 1.2 | 1.2 | 1.2 | 1.2 |
| pH | 8.8 | 8.8 | 8.8 | 8.8 | 8.8 | 8.8 | 8.8 | 8.8 | 8.8 |
| Final polishing |  |  |  |  |  |  |  |  |  |
| Abrasive | MgO | $CeO_2$ | $MnO_2$ | $SiO_2$ | $SiO_2$ | $SiO_2$ | $SiO_2$ | $SiO_2$ | $SiO_2$ |
| $H_{FIN}$ (Hv) | 300 | 600 | 450 | 700 | 700 | 700 | 700 | 700 | 700 |
| $P_{FIN}$ (nm) | 97 | 97 | 97 | 97 | 97 | 97 | 270 | 180 | 128 |
| [Abrasive] (wt. %) | 23 | 23 | 23 | 23 | 23 | 23 | 23 | 23 | 23 |
| Polishing aid $B_{FIN}$-1 | $NaVO_3$ | $NaVO_3$ | $NaVO_3$ | $(NH_4)_6Mo_7O_{24}$ | $Na_2WO_3$ | $NaIO_4$ | $NaVO_3$ | $NaVO_3$ | $NaVO_3$ |
| [$B_{FIN}$-1] (wt. %) | 1.9 | 1.9 | 1.9 | 1.9 | 1.9 | 1.9 | 1.9 | 1.9 | 1.9 |
| Polishing aid $B_{FIN}$-2 | $H_2O_2$ | $H_2O_2$ | $H_2O_2$ | $H_2O_2$ | $H_2O_2$ | $H_2O_2$ | $H_2O_2$ | $H_2O_2$ | $H_2O_2$ |
| [$B_{FIN}$-2] (wt. %) | 1.2 | 1.2 | 1.2 | 1.2 | 1.2 | 1.2 | 1.2 | 1.2 | 1.2 |
| pH | 6.5 | 6.5 | 6.5 | 6.5 | 6.5 | 6.5 | 6.5 | 6.5 | 6.5 |
| $H_{PRE}/H_{FIN}$ | 1.7 | 2.7 | 3.6 | 2.3 | 2.3 | 2.3 | 2.3 | 2.3 | 2.3 |
| $P_{PRE}/P_{FIN}$ | 5.2 | 5.2 | 5.2 | 5.2 | 5.2 | 5.2 | 1.9 | 2.8 | 3.9 |
| Flatness Zygo Ra (nm) | 1.5 | 1.1 | 1.1 | 1.3 | 1.3 | 1.3 | 0.9 | 0.9 | 0.8 |
| Smoothness AFM Ra (nm) | 0.12 | 0.10 | 0.10 | 0.12 | 0.12 | 0.13 | 0.12 | 0.11 | 0.10 |
| Polishing time | 190 | 150 | 150 | 170 | 170 | 150 | 110 | 110 | 100 |

|  | Ex. 26 | Ex. 27 | Ex. 28 | Ex. 29 | Ex. 30 | Ex. 31 | Ex. 32 | Ex. 33 | Ex. 34 |
|---|---|---|---|---|---|---|---|---|---|
| Preliminary polishing |  |  |  |  |  |  |  |  |  |
| Abrasive | $Al_2O_3$ | $Al_2O_3$ | $Al_2O_3$ | $Al_2O_3$ | $Al_2O_3$ | $Al_2O_3$ | $SiO_2$ | $Al_2O_3$ | — |
| $H_{PRE}$ (Hv) | 1600 | 1600 | 1600 | 1600 | 1600 | 1600 | 700 | 1600 | — |
| $P_{PRE}$ (nm) | 500 | 500 | 500 | 500 | 500 | 500 | 97 | 500 | — |
| [Abrasive] (wt. %) | 6 | 6 | 6 | 6 | 6 | 6 | 6 | 6 | — |
| Polishing aid $B_{PRE}$ | $KMnO_4$ | $KMnO_4$ | $KMnO_4$ | $KMnO_4$ | $KMnO_4$ | $KMnO_4$ | $KMnO_4$ | $KMnO_4$ | — |
| [Polishing aid] (wt. %) | 1.2 | 1.2 | 1.2 | 1.2 | 1.2 | 1.2 | 1.2 | 1.2 | — |
| pH | 8.8 | 8.8 | 8.8 | 8.8 | 8.8 | 8.8 | 8.8 | 8.8 | — |
| Final polishing |  |  |  |  |  |  |  |  |  |
| Abrasive | $SiO_2$ | $SiO_2$ | $SiO_2$ | $SiO_2$ | $SiO_2$ | $SiO_2$ | $SiO_2$ | — | $SiO_2$ |
| $H_{FIN}$ (Hv) | 700 | 700 | 700 | 700 | 700 | 700 | 700 | — | 700 |

TABLE 2-continued

| | | | | | | | | | |
|---|---|---|---|---|---|---|---|---|---|
| $P_{FIN}$ (nm) | 75 | 40 | 97 | 97 | 97 | 97 | 97 | — | 97 |
| [Abrasive] (wt. %) | 23 | 23 | 12 | 40 | 23 | 23 | 23 | — | 23 |
| Polishing aid $B_{FIN}$-1 | $NaVO_3$ | $NaVO_3$ | $NaVO_3$ | $NaVO_3$ | $NaVO_3$ | $NaVO_3$ | $NaVO_3$ | — | $NaVO_3$ |
| [$B_{FIN}$-1] (wt. %) | 1.9 | 1.9 | 1.9 | 1.9 | 0.8 | 3.8 | 1.9 | — | 1.9 |
| Polishing aid $B_{FIN}$-2 | $H_2O_2$ | $H_2O_2$ | $H_2O_2$ | $H_2O_2$ | $H_2O_2$ | $H_2O_2$ | $H_2O_2$ | — | $H_2O_2$ |
| [$B_{FIN}$-2] (wt. %) | 1.2 | 1.2 | 1.2 | 1.2 | 1.2 | 1.2 | 1.2 | — | 1.2 |
| pH | 6.5 | 6.5 | 6.5 | 6.5 | 6.5 | 6.5 | 6.5 | — | 6.5 |
| $H_{PRE}/H_{FIN}$ | 2.3 | 2.3 | 2.3 | 2.3 | 2.3 | 2.3 | 1.0 | — | — |
| $P_{PRE}/P_{FIN}$ | 6.7 | 12.5 | 5.2 | 5.2 | 5.2 | 5.2 | 1.0 | — | — |
| Flatness Zygo Ra (nm) | 0.8 | 0.9 | 0.9 | 0.8 | 0.8 | 0.8 | 2.5 | 1.7 | 3.0 |
| Smoothness AFM Ra (nm) | 0.10 | 0.11 | 0.09 | 0.09 | 0.09 | 0.10 | 0.10 | 0.34 | 0.10 |
| Polishing time | 100 | 120 | 120 | 100 | 120 | 120 | 180 | 300 | 420 |

As shown in Table 1 and Table 2, both smoothness and flatness were achieved efficiently by the polishing methods according to Examples 1 to 31 in which preliminary polishing and final polishing were performed and an abrasive lower in hardness than the abrasive $A_{PRE}$ for preliminary polishing was used as the abrasive $A_{FIN}$ for final polishing. On the other hand, in Example 32 where the abrasive $A_{PRE}$ for preliminary polishing and the abrasive $A_{FIN}$ for final polishing were equally hard, smoothness and flatness were not achieved together even after a longer time of polishing. In Examples 33 and 34 in which single-step polishing was performed, smoothness and flatness were not achieved together, either, even after a longer time of polishing. When Examples 1 to 16 and 18 to 31 are compared to Examples 17 and 32, it is evident that both smoothness and flatness are more efficiently achieved at a higher level on a super-hard surface when the abrasive $A_{PRE}$ has a Vickers hardness in the range of 800 Hv to 3000 Hv and the abrasive $A_{FIN}$ has a Vickers hardness in the range of 200 Hv to 1500 Hv. When Examples 1, 2, and 4 to 31 are compared to Examples 3 and 32, it is evident that both smoothness and flatness are more efficiently achieved at a higher level on a super-hard surface when the mean secondary particle diameter $P_{PRE}$ of the abrasive $A_{PRE}$ is greater than the mean secondary particle diameter $P_{FIN}$ of the abrasive $A_{FIN}$.

More specifically the results of Examples 1 to 6 with varied mean secondary particle diameters of abrasive $A_{PRE}$ show a tendency that as the mean secondary particle diameter of the abrasive $A_{PRE}$ increases, both smoothness and flatness improve; and when the mean secondary particle diameter increases beyond about 500 nm, both smoothness and flatness decrease (degrade). The results of Examples 7 and 8 with varied concentrations of abrasive $A_{PRE}$ indicate that in order to obtain excellent flatness, it is desirable to have a higher abrasive concentration. From the results of Examples 9 and 10 with varied concentrations of polishing aid $B_{PRE}$, it is presumed that when the polishing aid $B_{PRE}$ is far too much or far too little, smoothness and flatness tend to decrease (degrade) and there exists an optimized concentration range for the polishing aid $B_{PRE}$. The results of Examples 11 and 12 with varied species of abrasive $A_{PRE}$ indicate that a species having a higher Vickers hardness is advantageous to increase the flatness; in particular, $Al_2O_3$ works the best. The results of Examples 13 to 16 with varied species of polishing aid $B_{PRE}$ show that both smoothness and flatness are achieved at a higher level when a composite metal oxide (especially a composite metal oxide $CMO_{PRE}$) is used as the polishing aid $B_{PRE}$. In Example 15 using $NaIO_4$, the pad color changed after the polishing. A similar color change occurred also in Example 22 where $NaIO_4$ was used in final polishing.

Based on the results of Examples 17 to 19 with varied species of abrasive $A_{FIN}$, the higher the Vickers hardness is, the more advantageous it is to achieve both smoothness and flatness. In particular, $SiO_2$ worked the best. The results of Examples 20 to 22 with varied species of polishing aid $B_{FIN}$ indicate that $NaVO_3$ works the best as the polishing aid $B_{FIN}$. In Examples 20 and 21, gelation of the final polishing compositions was observed. This indicates that certain species of polishing aid $B_{FIN}$ decrease the composition stability. From the results of Examples 23 to 27 with varied mean secondary particle diameters of abrasive $A_{FIN}$, it is evident that smoothness and flatness can be achieved together when the abrasive $A_{FIN}$ has a mean secondary particle diameter in a certain range. The results of Examples 28 and 29 with varied concentrations of abrasive $A_{FIN}$ indicate that the higher the abrasive concentration is, the more advantageous it is to increase the flatness. From the results of Examples 30 and 31 with varied concentrations of polishing aid $B_{FIN}$, it is presumed that, to increase the smoothness, it is advantageous that the concentration of polishing aid $B_{FIN}$ is in a somewhat limited range.

The polishing methods according to Examples 1 to 31 achieved desirable properties (smoothness combined with flatness) as compared to Examples 33 and 34 where single-step polishing was performed, in particular, in two-third or less than two-third the polishing time taken in Example 33 and in half or less than half the polishing time taken in Example 34. In Examples 1 to 10, 13 to 15, 18, 19 and 22 to 31, desirable properties were achieved in half or less than half the polishing time taken in Example 33. In particular, in Examples 1, 4, 8, 10, 23 to 26 and 29 (especially Examples 1, 8, 25, 26, and 29), both smoothness and flatness were achieved at a significantly higher level as compared to the Examples of single-step polishing, in about one-third the polishing time taken in Example 33 and in about one-fourth the polishing time taken in Example 34. It can be seen that according to the art disclosed herein, by a highly productive method, both flatness and smoothness are achieved at a level that wouldn't have been achieved by the conventional art.

Experiment 2

Examples 35 to 37

(Preparation of Preliminary Polishing Compositions)

Were mixed an abrasive $A_{PRE}$, a polishing aid $B_{PRE}$ and deionized water to prepare each preliminary polishing composition. Table 3 shows the species of abrasive $A_{PRE}$ with their mean secondary particle diameters (nm) and the species of polishing aid $B_{PRE}$ used in the respective examples as well as the compositions (concentrations of abrasive $A_{PRE}$ and polishing aid $B_{PRE}$), the pH values and the oxidation-reduction potentials $ORP_{PRE}$ of the preliminary polishing compositions according to the respective examples.

(Preparation of Final Polishing Compositions)

Were mixed an abrasive $A_{FIN}$, a polishing aid $B_{FIN}$ and deionized water to prepare each final polishing composition. Table 3 show the species of abrasive $A_{FIN}$ with their mean secondary particle diameters (nm) and the species of polishing aid $B_{FIN}$ used in the respective examples as well as the compositions (concentrations of abrasive $A_{FIN}$ and polishing aid $B_{FIN}$), the pH values and the oxidation-reduction potentials $ORP_{FIN}$ of the final polishing compositions according to the respective examples.

(Determination of Oxidation-Reduction Potential)

The oxidation-reduction potentials vs. standard hydrogen electrode of the polishing compositions of the respective Examples were determined at a liquid temperature of 25° C., using an oxidation-reduction potentiometer (meter model: F-52, electrode model: 9300) available from Horiba, Ltd.

(Preliminary Polishing)

Using the preliminary polishing compositions obtained and a diamond abrasive having a mean particle diameter of 5 μm, surfaces of pre-lapped SiC wafers were subjected to preliminary polishing under the conditions shown below.

[Conditions of Preliminary Polishing]

Polishing machine: single-face polishing machine, model EJ-380IN, available from Engis Japan Corporation Polishing pad: trade name SUBA800 available from Nitta Haas Inc.

Polishing pressure: 300 g/cm$^2$
   Platen rotational speed: 80 rpm
   Head rotational speed: 40 rpm
   Flow rate of polishing slurry: 20 mL/min (flow-through)
   Temperature of polishing slurry: 25° C.
   Polished object: SiC wafer (n-type conduction, crystal type: 4H 4° off) 2 inches The time of preliminary polishing was one hour. In Example 36, polishing was carried out for as long as it took to uniform smoothness by monitoring the smoothness (surface roughness) of the surface of the object over a measurement area of 10 μm by 10 μm during the polishing, using an atomic force microscope.

(Final Polishing)

Subsequently, using the final polishing compositions obtained as they were as polishing slurries, surfaces of the preliminarily-polished SiC wafers were subjected to final polishing under the conditions shown below. In Example 36, final polishing was not performed.

[Conditions of Final Polishing]

Polishing machine: single-face polishing machine, model EJ-380IN, available from Engis Japan Corporation Polishing pad: trade name SURFIN 019-3 available from Fujimi Incorporated Polishing pressure: 300 g/cm$^2$
   Platen rotational speed: 80 rpm
   Head rotational speed: 40 rpm
   Flow rate of polishing slurry: 20 mL/min (flow-through)
   Temperature of polishing slurry: 25° C.
   Polished object: SiC wafer (n-type conduction, crystal type: 4H 4° off) 2 inches Final polishing was carried out for as long as it took to uniform smoothness by monitoring the smoothness (surface roughness) of the surface of the object over a measurement area of 10 μm by 10 μm during the polishing, using an atomic force microscope.

<Flatness>

With respect to the polished surface of the object according to each Example, using a non-contact profilometer system (trade name NewView 5032 available from Zygo Corporation), the surface roughness value Ra (nm) was measured at 10× magnification over a measurement area of 700 μm×500 μm. The results are shown in Table 3.

<Scratches>

Using a differential interference microscope (trade name OPTIPHOTO 300 available from Nikon Corporation), the polished surface of the object according to each Example was analyzed in ten fields of vision having a measurement area of 1 mm×0.7 mm. When the polished surface had no scratches, it was graded "G" (good quality); when the polished surface had scratches, it was graded "D" (defective). The results are shown in Table 3.

<Polishing Time>

In Table 3, the total time of polishing (the combined time of preliminary polishing and final polishing) in each Example is shown as a relative value with the total polishing time of Example 35 being 100. The larger the value is, the longer the polishing time is; the smaller the value is, the shorter the polishing time is.

TABLE 3

|  | Ex. 35 | Ex. 36 | Ex. 37 |
| --- | --- | --- | --- |
| Preliminary polishing |  |  |  |
| Abrasive | Al$_2$O$_3$ | Al$_2$O$_3$ | SiO$_2$ |
| ORP$_{PRE}$ (mV) | 915 | 915 | 497 |
| P$_{PRE}$ (nm) | 500 | 500 | 97 |
| [Abrasive] (wt. %) | 6 | 6 | 23 |
| Polishing aid | KMnO$_4$ | KMnO$_4$ | NaVO$_3$/H$_2$O$_2$ |
| [Polishing aid] (wt. %) | 1.2 | 1.2 | 1.9/1.2 |
| pH | 8.8 | 8.8 | 6.5 |
| Final polishing |  |  |  |
| Abrasive | SiO$_2$ | — | Al$_2$O$_3$ |
| ORP$_{FIN}$ (mV) | 497 | — | 915 |
| P$_{FIN}$ (nm) | 97 | — | 500 |
| [Abrasive] (wt. %) | 23 | — | 6 |
| Polishing aid | NaVO$_3$/H$_2$O$_2$ | — | KMnO$_4$ |
| [Polishing aid] (wt. %) | 1.9/1.2 | — | 1.2 |
| pH | 6.5 | — | 8.8 |
| ORP$_{PRE}$/ORP$_{FIN}$ | 1.8 | — | 0.54 |
| Surface roughness Ra [nm] | 0.8 | 1.7 | 2.2 |
| Scratches | G | D | D |
| Polishing time | 100 | 300 | 400 |

As shown in Table 3, by the polishing method according to Example 35 where preliminary polishing and final polishing were performed with the final polishing composition having a lower oxidation-reduction potential than the preliminary polishing composition, a polished surface was obtained, free of scratches, with a small surface roughness value Ra. On the other hand, in Example 37 in which the final polishing composition had a higher oxidation-reduction potential than the preliminary polishing composition, the surface roughness value Ra was greater than that of Example 35 with a lack of overall flatness of the polished surface. Scratches were also observed on the polished surface with a lack of smoothness. Also in Example 36 where single-step polishing was performed, the surface roughness value Ra was greater than that of Example 35 with a lack of overall flatness of the polished surface. Scratches were also observed on the polished surface with a lack of smoothness. These results show that when a final polishing composition having a lower oxidation-reduction potential than the preliminary polishing composition is used as the final polishing composition, smoothness and flatness can be achieved at the same time.

The polishing method according to Example 35 achieved desirable properties (smoothness combined with flatness) in about one-third the polishing time taken in Example 36 where single-stage polishing was performed. According to the art disclosed herein, on the surface of a super-hard material such as SiC, smoothness and flatness can be achieved at an unattainable level for the conventional art by a highly productive method.

Experiment 3

Examples 38 to 40

(Preparation of Preliminary Polishing Compositions)

Were mixed an abrasive $A_{PRE}$, a polishing aid $B_{PRE}$ and deionized water to prepare each preliminary polishing composition. Table 4 shows the species of abrasive $A_{PRE}$ with their mean secondary particle diameters (nm) and the species of polishing aid $B_{PRE}$ used in the respective examples as well as the compositions (concentrations of abrasive $A_{PRE}$ and polishing aid $B_{PRE}$), the pH values and the standard polishing removal rates $R_{PRE}$ of the preliminary polishing compositions according to the respective examples. The standard polishing removal rates $R_{PRE}$ were determined based on the aforementioned standard polishing test.

(Preparation of Final Polishing Compositions)

Were mixed an abrasive $A_{FIN}$, a polishing aid $B_{FIN}$ and deionized water to prepare each final polishing composition. Table 4 show the species of abrasive $A_{FIN}$ with their mean secondary particle diameters (nm) and the species of polishing aid $B_{FIN}$ used in the respective examples as well as the compositions (concentrations of abrasive $A_{FIN}$ and polishing aid $B_{FIN}$), the pH values and the standard polishing removal rates $R_{FIN}$ of the final polishing compositions according to the respective examples. The standard polishing removal rates $R_{FIN}$ were determined based on the aforementioned standard polishing test.

(Preliminary Polishing)

Using the preliminary polishing compositions obtained and a diamond abrasive having a mean particle diameter of 5 μm, surfaces of pre-lapped SiC wafers were subjected to preliminary polishing under the conditions shown below.

[Conditions of Preliminary Polishing]

Polishing machine: single-face polishing machine, model EJ-380IN, available from Engis Japan Corporation Polishing pad: trade name SUBA800 available from Nitta Haas Inc.

Polishing pressure: 300 g/cm$^2$

Platen rotational speed: 80 rpm

Head rotational speed: 40 rpm

Flow rate of polishing slurry: 20 mL/min (flow-through)

Temperature of polishing slurry: 25° C.

Polished object: SiC wafer (n-type conduction, crystal type: 4H 4° off) 2 inches The time of preliminary polishing was one hour. In Example 39, polishing was carried out for as long as it took to uniform smoothness by monitoring the smoothness (surface roughness) of the surface of the object over a measurement area of 10 μm by 10 μm during the polishing, using an atomic force microscope.

(Final Polishing)

Subsequently, using the final polishing compositions obtained as they were as polishing slurries, surfaces of the preliminarily-polished SiC wafers were subjected to final polishing under the conditions shown below. In Example 39, final polishing was not performed.

[Conditions of Final Polishing]

Polishing machine: single-face polishing machine, model EJ-3801N, available from Engis Japan Corporation Polishing pad: trade name SURFIN 019-3 available from Fujimi Incorporated Polishing pressure: 300 g/cm$^2$ Platen rotational speed: 80 rpm Head rotational speed: 40 rpm Flow rate of polishing slurry: 20 mL/min (flow-through)

Temperature of polishing slurry: 25° C.

Polished object: SiC wafer (n-type conduction, crystal type: 4H 4° off) 2 inches Final polishing was carried out for as long as it took to uniform smoothness by monitoring the smoothness (surface roughness) of the surface of the object over a measurement area of 10 μm by 10 μm during the polishing, using an atomic force microscope.

<Flatness>

With respect to the polished surface of the object according to each Example, using a non-contact profilometer system (trade name NewView 5032 available from Zygo Corporation), the surface roughness value Ra (nm) was measured at 10× magnification over a measurement area of 700 μm×500 μm. The results are shown in Table 4.

<Scratches>

Using a differential interference microscope (trade name OPTIPHOTO 300 available from Nikon Corporation), the polished surface of the object according to each Example was analyzed in ten fields of vision having a measurement area of 1 mm×0.7 mm. When the polished surface had no scratches, it was graded "G" (good quality); when the polished surface had scratches, it was graded "D" (defective). The results are shown in Table 4.

<Polishing Time>

In Table 4, the total time of polishing (the combined time of preliminary polishing and final polishing) in each Example is shown as a relative value with the total polishing time of Example 38 being 100. The larger the value is, the longer the polishing time is; the smaller the value is, the shorter the polishing time is.

TABLE 4

|  | Ex. 38 | Ex. 9 | Ex. 40 |
| --- | --- | --- | --- |
| Preliminary polishing |  |  |  |
| Abrasive | Al$_2$O$_3$ | Al$_2$O$_3$ | SiO$_2$ |
| R$_{PRE}$ (nm/h) | 770 | 770 | 320 |
| P$_{PRE}$ (nm) | 500 | 500 | 97 |
| [Abrasive] (wt. %) | 6 | 6 | 23 |
| Polishing aid | KMnO$_4$ | KMnO$_4$ | NaVO$_3$/H$_2$O$_2$ |
| [Polishing aid] (wt. %) | 1.2 | 1.2 | 1.9/1.2 |
| pH | 8.8 | 8.8 | 6.5 |
| Final polishing |  |  |  |
| Abrasive | SiO$_2$ | — | Al$_2$O$_3$ |
| R$_{FIN}$ (nm/h) | 320 | — | 770 |
| P$_{FIN}$ (nm) | 97 | — | 500 |
| [Abrasive] (wt. %) | 23 | — | 6 |
| Polishing aid | NaVO$_3$/H$_2$O$_2$ | — | KMnO$_4$ |
| [Polishing aid] (wt. %) | 1.9/1.2 | — | 1.2 |
| pH | 6.5 | — | 8.8 |
| R$_{PRE}$/R$_{FIN}$ | 2.4 | — | 0.42 |
| Surface roughness Ra [nm] | 0.8 | 1.7 | 2.2 |
| Scratches | G | D | D |
| Polishing time | 100 | 300 | 400 |

As shown in Table 4, by the polishing method according to Example 38 where preliminary polishing and final polishing were performed with the final polishing composition having a lower standard polishing removal rate than the preliminary polishing composition, a polished surface was obtained, free of scratches, with a small surface roughness value Ra. On the other hand, in Example 40 in which the final polishing composition had a higher standard polishing removal rate than the preliminary polishing composition, the surface roughness value Ra was greater than that of Example 38 with a lack of overall flatness of the polished surface. Scratches were also observed on the polished surface with a lack of smoothness. Also in Example 39 where single-step polishing was performed, the surface roughness value Ra was greater than that of Example 38 with a lack of overall flatness of the polished surface. Scratches were also observed on the polished surface with a lack of smoothness. These results show that when a final polishing composition having a lower standard polishing removal rate than the preliminary polishing composition is used as the final polishing composition, smoothness and flatness can be achieved at the same time.

The polishing method according to Example 38 achieved desirable properties (smoothness combined with flatness) in about one-third the polishing time taken in Example 39 where single-stage polishing was performed. According to the art disclosed herein, on the surface of a super-hard material such as SiC, smoothness and flatness can be achieved at an unattainable level for the conventional art by a highly productive method.

Although specific embodiments of the present invention have been described in detail above, these are merely for illustrations and do not limit the scope of claims. The art according to the claims includes various modifications and changes made to the specific embodiments illustrated above.

INDUSTRIAL APPLICABILITY

The present invention can provide a polishing method capable of efficiently achieving both smoothness and flatness on a super-hard surface.

The invention claimed is:
1. A method for polishing, comprising the steps of:
preliminarily polishing a material using a polishing pad and a preliminary polishing composition, the material having a Vickers hardness of 1500 Hv or higher, and the preliminary polishing composition comprises an abrasive $A_{PRE}$ having a Vickers hardness of 3000 Hv or lower; and
carrying out final polishing of the material using a polishing pad and a final polishing composition,
wherein the preliminary polishing composition has an oxidation-reduction potential $ORP_{PRE}$ vs. standard hydrogen electrode, and the final polishing composition has an oxidation-reduction potential $ORP_{FIN}$ vs. standard hydrogen electrode, satisfying a relation $ORP_{PRE} > ORP_{FIN}$.

2. The method according to claim 1, having a ratio $ORP_{PRE}:ORP_{FIN}$ of the oxidation-reduction potential $ORP_{PRE}$ of the preliminary polishing composition to the oxidation-reduction potential $ORP_{FIN}$ of the final polishing composition, satisfying $1.2 \leq ORP_{PRE}:ORP_{FIN} \leq 4.0$.

3. The method according to claim 1, wherein the oxidation-reduction potential $ORP_{PRE}$ of the preliminary polishing composition is in a range of 700 mV to 1500 mV, and the oxidation-reduction potential $ORP_{FIN}$ of the final polishing composition is in a range of 300 mV to 650 mV.

4. A method for polishing, comprising the steps of:
preliminarily polishing a material using a polishing pad and a preliminary polishing composition that comprises an abrasive $A_{PRE}$ and a water-soluble polishing aid $B_{PRE}$;
the material having a Vickers hardness of 1500 Hv or higher,
the abrasive $A_{PRE}$ has a Vickers hardness of 3000 Hv or lower;
the polishing aid $B_{PRE}$ comprises a composite metal oxide $CMO_{PRE}$, the composite metal oxide $CMO_{PRE}$ having a monovalent or divalent metal (but not a transition metal), and a transition metal in the fourth period of the periodic table, and
carrying out final polishing of the material using a polishing pad and a final polishing composition that comprises an abrasive $A_{FIN}$,
wherein the preliminary polishing composition has a standard polishing removal rate $R_{PRE}$ on a SiC wafer, and the final polishing composition has a standard polishing removal rate $R_{FIN}$ on the SiC wafer, satisfying a relation $R_{PRE} > R_{FIN}$.

5. The method according to claim 4, having a ratio $R_{PRE}:R_{FIN}$ of the standard polishing removal rate $R_{PRE}$ of the preliminary polishing composition to the standard polishing removal rate $R_{FIN}$ of the final polishing composition, satisfying $1.5 \leq R_{PRE}:R_{FIN} \leq 5.0$.

6. The method according to claim 4, wherein the abrasive $A_{PRE}$ has a mean secondary particle diameter $P_{PRE}$ and the abrasive $A_{FIN}$ has a mean secondary particle diameter $P_{FIN}$, satisfying a relation $P_{PRE} > P_{FIN}$.

7. The method according to claim 4, wherein the abrasive $A_{PRE}$ has a Vickers hardness $H_{PRE}$ and the abrasive $A_{FIN}$ has a Vickers hardness $H_{FIN}$, satisfying a relation $H_{PRE} > H_{FIN}$.

8. A polishing composition kit comprising:
a preliminary polishing composition comprising an abrasive $A_{PRE}$; and
a final polishing composition;
wherein the final polishing composition comprises an abrasive $A_{FIN}$, and a water-soluble polishing aid $B_{FIN}$ comprising a composite metal oxide $CMO_{FIN}$,
the composite metal oxide $CMO_{FIN}$ has a monovalent or divalent metal (but not a transition metal) or ammonia, and a transition metal in group 5 of the periodic table, and
the abrasive $A_{FIN}$ is lower in hardness than the abrasive $A_{PRE}$.

9. A polishing composition kit comprising:
a preliminary polishing composition having an oxidation-reduction potential $ORP_{PRE}$ versus standard hydrogen electrode; and
a final polishing composition having an oxidation-reduction potential $ORP_{FIN}$ versus standard hydrogen electrode;
wherein $ORP_{PRE} > ORP_{FIN}$, and the oxidation-reduction potential $ORP_{PRE}$ of the preliminary polishing composition is in a range of 700 mV to 1500 mV, and the oxidation-reduction potential $ORP_{FIN}$ of the final polishing composition is in a range of 300 mV to 650 mV.

10. A polishing composition kit comprising:
a preliminary polishing composition having a standard polishing removal rate $R_{PRE}$ on a SiC wafer; and
a final polishing composition having a standard polishing removal rate $R_{FIN}$ on the SiC wafer, wherein $R_{PRE} > R_{FIN}$;
wherein the final polishing composition comprises a water-soluble polishing aid $B_{FIN}$ comprising a composite metal oxide $COM_{FIN}$, and
the composite metal oxide $COM_{FIN}$ has a monovalent or divalent metal (but not a transition metal) or ammonia, and a transition metal in group 5 of the periodic table.

* * * * *